(12) United States Patent
Masuoka et al.

(10) Patent No.: US 8,211,809 B2
(45) Date of Patent: Jul. 3, 2012

(54) METHOD OF PRODUCING SEMICONDUCTOR DEVICE

(75) Inventors: Fujio Masuoka, Tokyo (JP); Shintaro Arai, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 568 days.

(21) Appl. No.: 12/551,846

(22) Filed: Sep. 1, 2009

(65) Prior Publication Data

US 2010/0087017 A1 Apr. 8, 2010

Related U.S. Application Data

(60) Provisional application No. 61/207,635, filed on Feb. 13, 2009.

(30) Foreign Application Priority Data

Sep. 2, 2008 (JP) .................... PCT/JP2008/065718

(51) Int. Cl.
*H01L 21/302* (2006.01)
(52) U.S. Cl. ............ 438/738; 438/9; 438/734; 438/735; 438/740
(58) Field of Classification Search .................. 438/8, 9, 438/268, 585, 714, 734, 735, 736, 738, 740
See application file for complete search history.

(56) References Cited

U.S. PATENT DOCUMENTS

| | | | |
|---|---|---|---|
| 6,281,068 B1 | 8/2001 | Coronel et al. | |
| 7,115,476 B1 | 10/2006 | Izumida | |
| 2004/0188725 A1 | 9/2004 | Fujiwara et al. | |
| 2005/0202632 A1* | 9/2005 | Ding | 438/257 |
| 2006/0081939 A1* | 4/2006 | Akasaka et al. | 257/371 |
| 2007/0007601 A1* | 1/2007 | Hsu et al. | 257/368 |
| 2009/0014779 A1* | 1/2009 | Kawashima et al. | 257/324 |
| 2009/0179310 A1* | 7/2009 | Dunton et al. | 257/656 |

FOREIGN PATENT DOCUMENTS

JP 02-188966 A 7/1990
(Continued)

OTHER PUBLICATIONS

Written Opinion of the International Searching Authority for International Application No. PCT/JP2008/065718, dated Oct. 7, 2008, 4 pages.

(Continued)

*Primary Examiner* — Lan Vinh
(74) *Attorney, Agent, or Firm* — Brinks Hofer Gilson & Lione

(57) ABSTRACT

It is intended to produce a semiconductor device with a stable gate length, using an end-point detection process based on monitoring a plasma emission intensity during dry etching for setting a gate length. A semiconductor device production method of the present invention comprises the steps of: forming a first dielectric or gate conductive film to allow a pillar-shaped semiconductor layer to be buried therein; flattening the first dielectric or gate conductive film while detecting an end-point using a stopper formed on top of the pillar-shaped semiconductor layer; forming a second dielectric or gate conductive film; etching the second dielectric or gate conductive film and calculating an etching rate during the etching; and detecting an end-point of etching of the first dielectric or gate conductive film, based on the etching rate of the second dielectric or gate conductive film during etching-back of the second dielectric or gate conductive film, to control an etching amount of the first dielectric or gate conductive film.

8 Claims, 23 Drawing Sheets

FOREIGN PATENT DOCUMENTS

| | | |
|---|---|---|
| JP | 2004-128094 A | 4/2004 |
| JP | 2004-296491 A | 10/2004 |
| JP | 2006-310651 A | 11/2006 |

OTHER PUBLICATIONS

Li, Ruigang et al., "50nm Vertical Surround Gate MOSFET with S-factor of 75mV/dec", Abstract, Device Research Conference, 2001, pp. 63-64.

Takato, H. et al., "High Performance CMOS Surrounding Gate Transistor (SGT) for Ultra High Density LSIs", Abstract, International Electron Devices Meeing, 1988, pp. 222-225.

European Search Report for European Application No. 09169108.9, dated May 11, 2010, 7 pages.

* cited by examiner

[Figure 1]
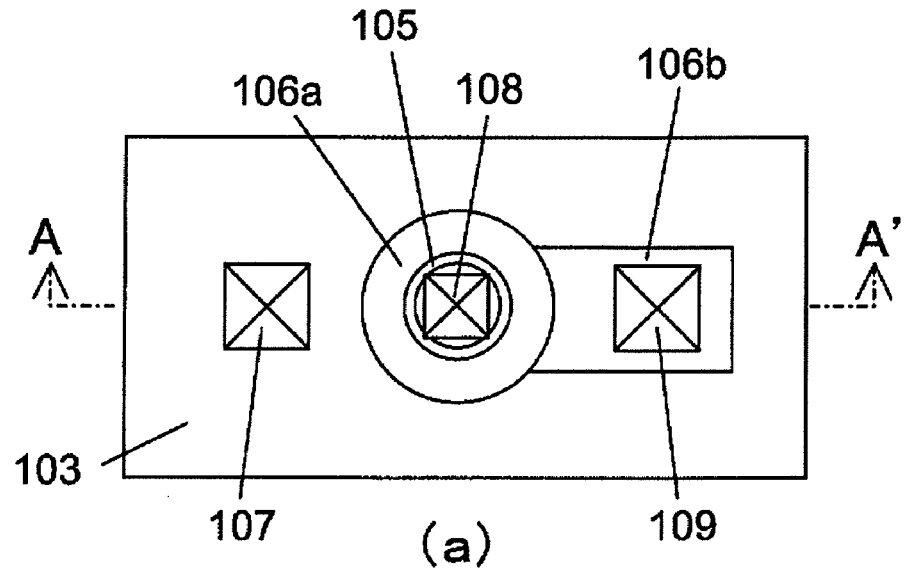
(a)
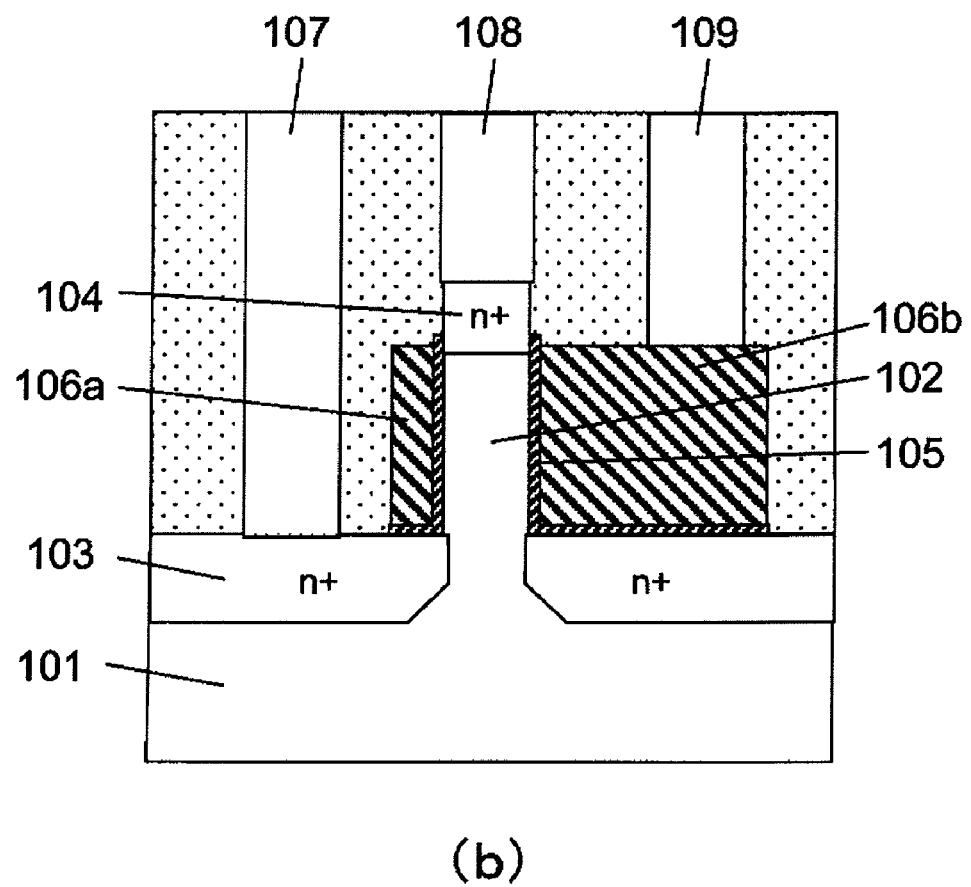
(b)

[Figure 2]
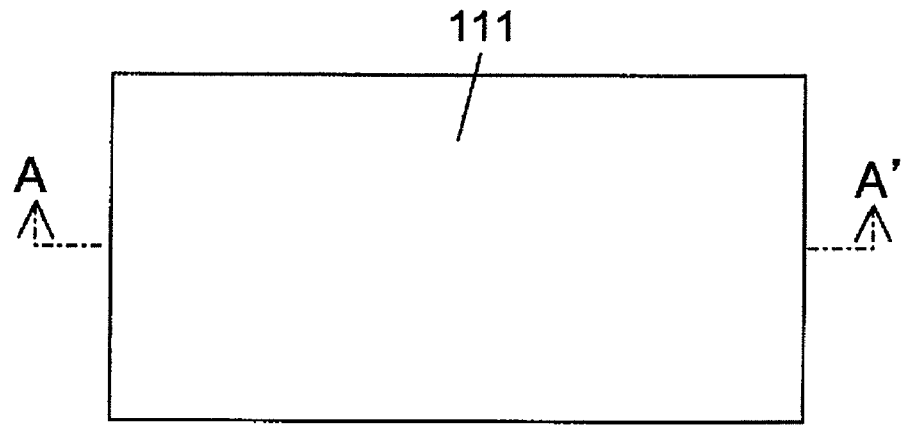
(a)
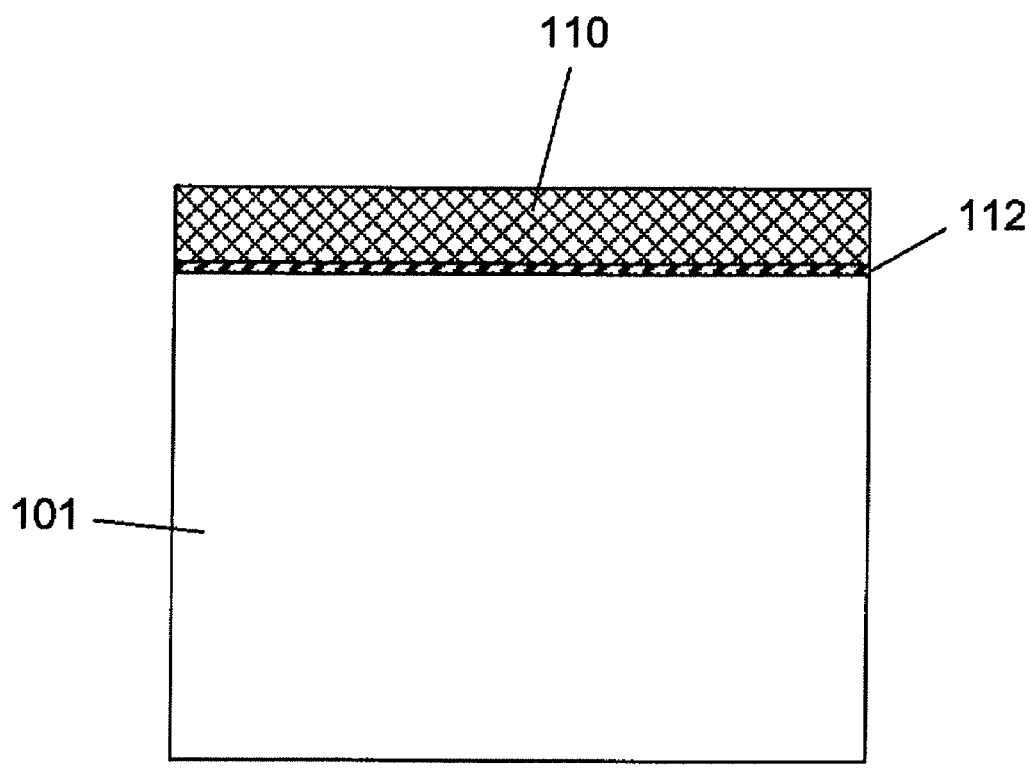
(b)

[Figure 3]
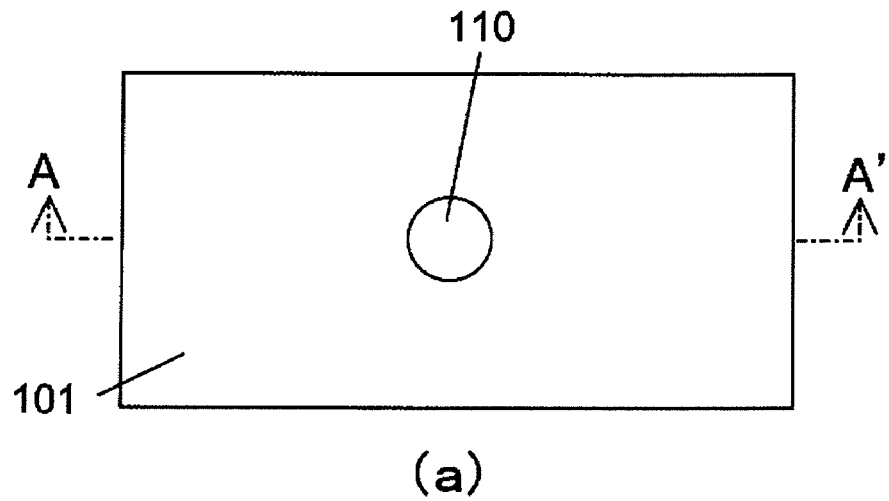
(a)
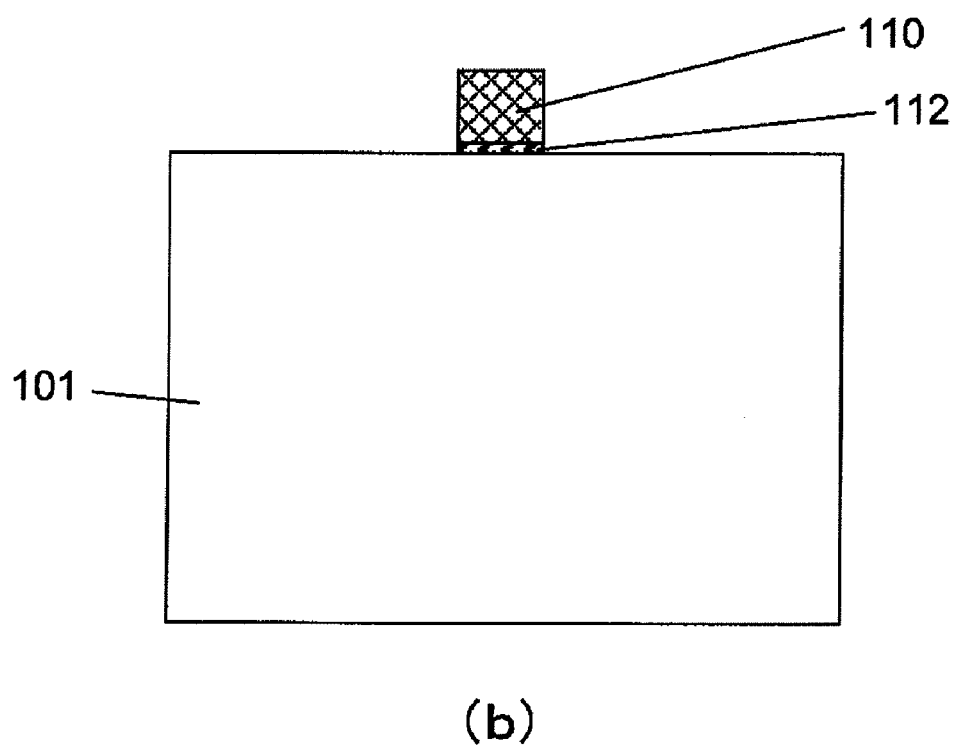
(b)

【Figure 4】
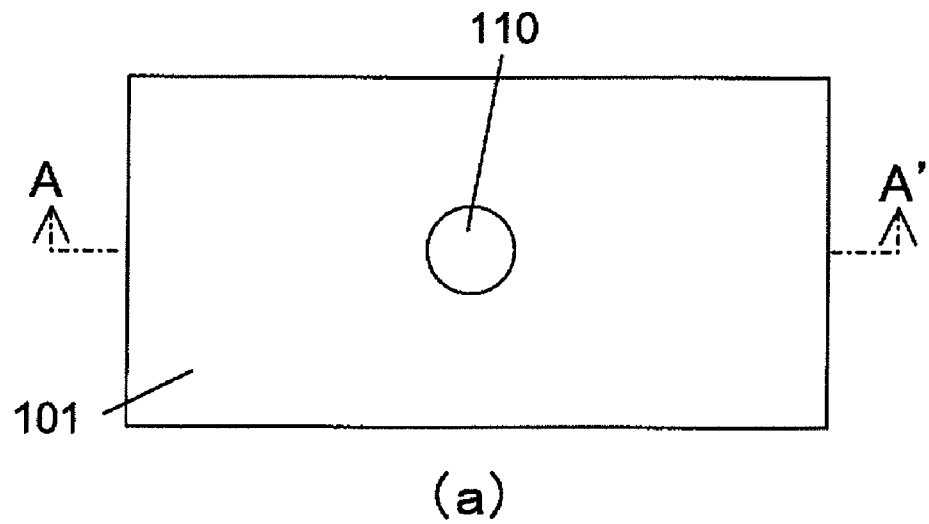
(a)
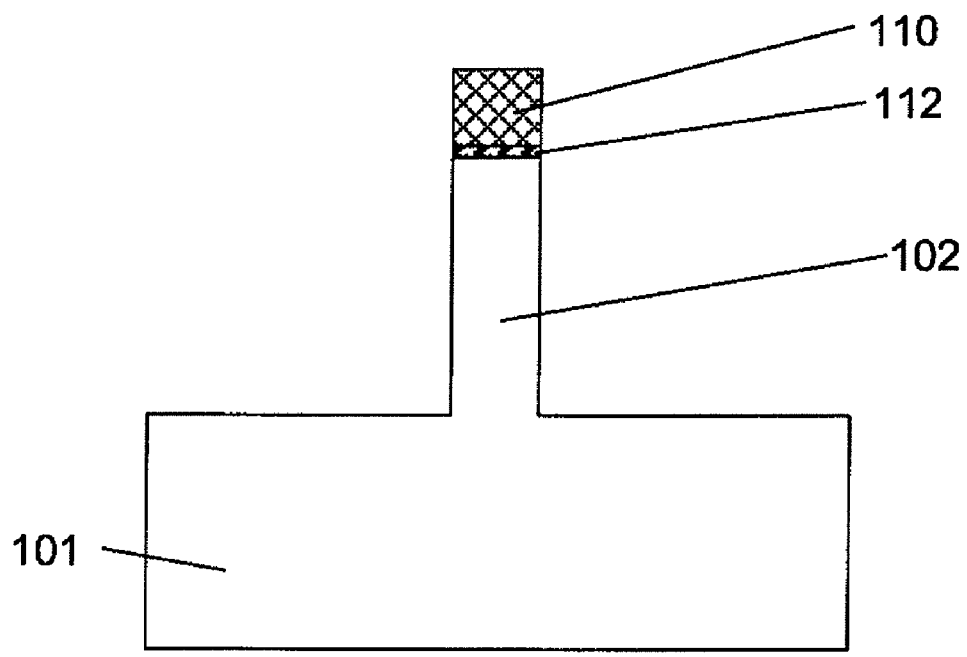
(b)

[Figure 5]
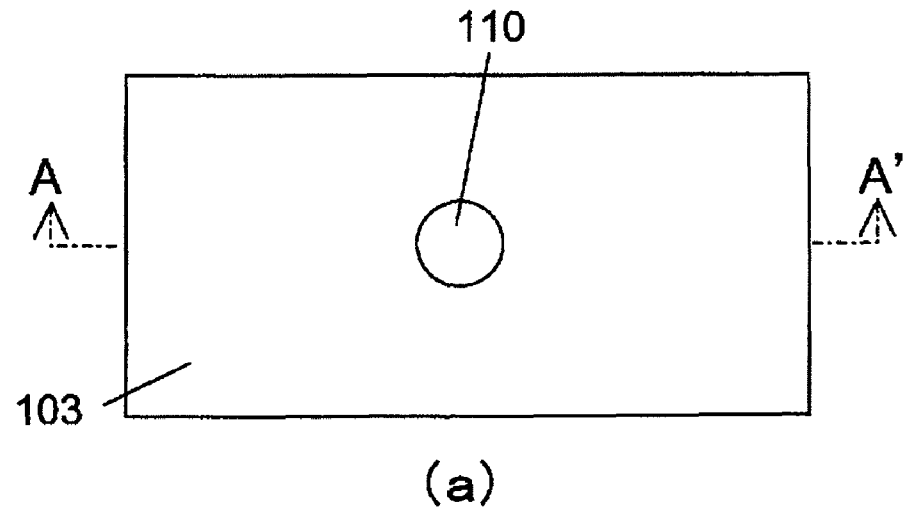
(a)
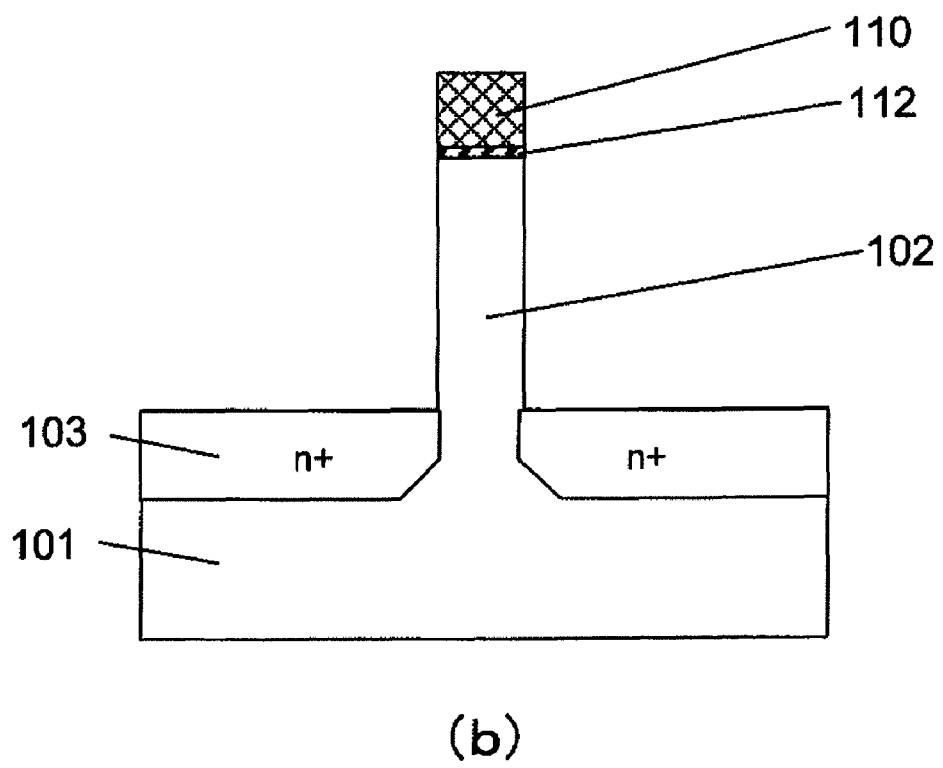
(b)

[Figure 6]
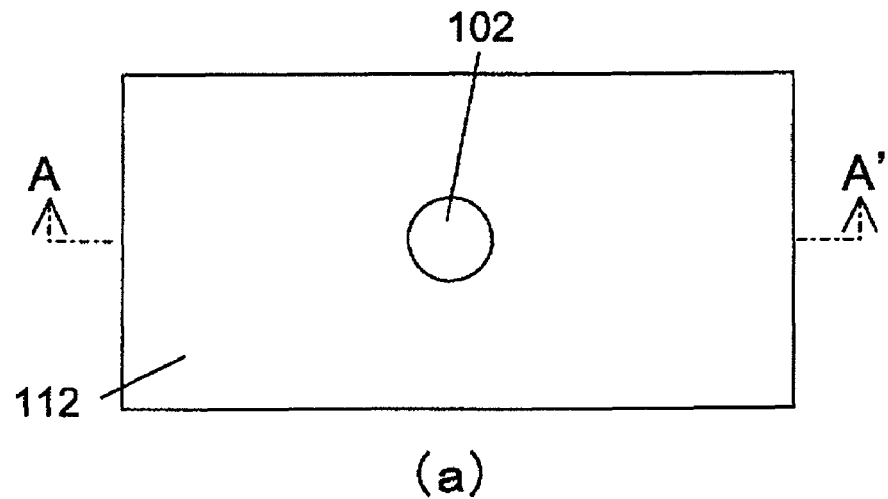
(a)
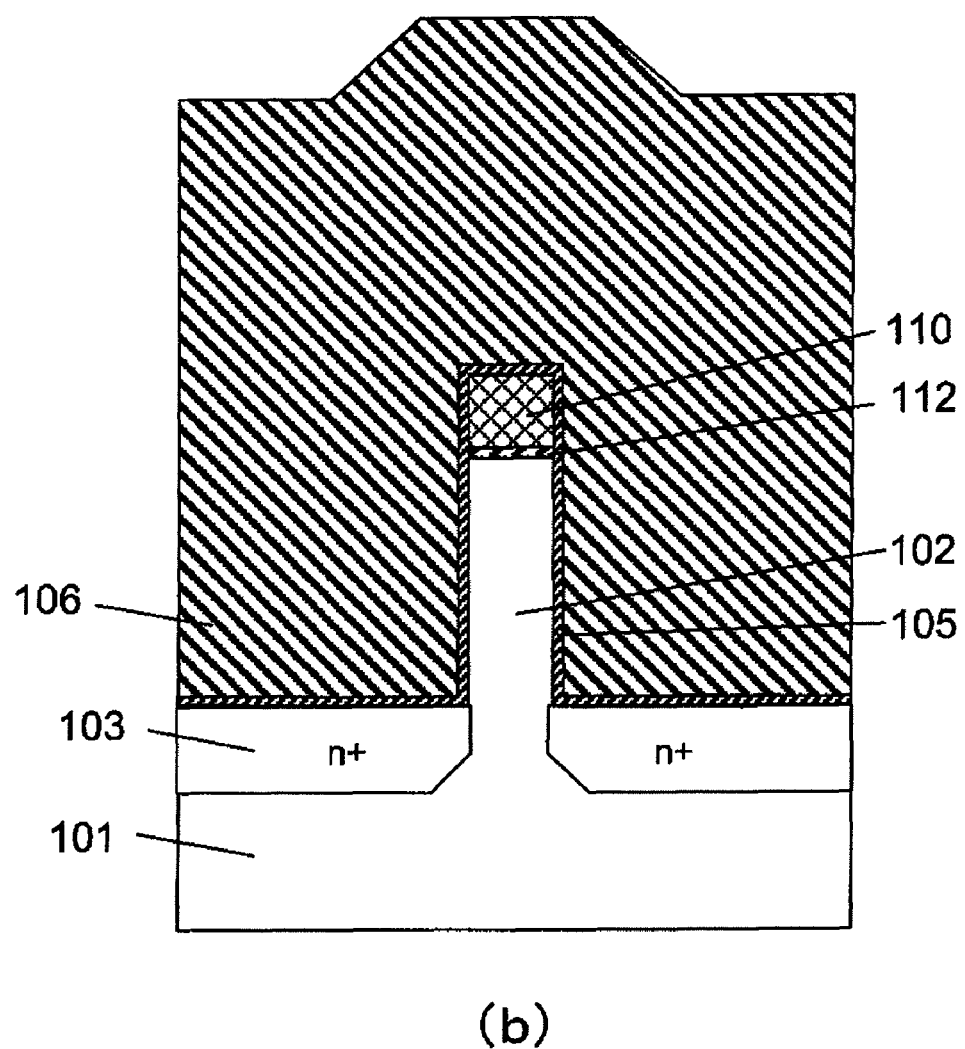
(b)

[Figure 7]
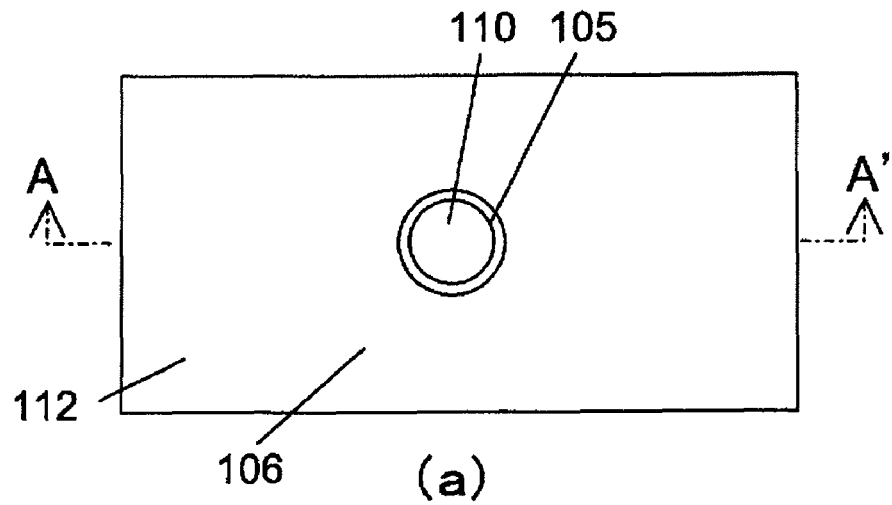
(a)
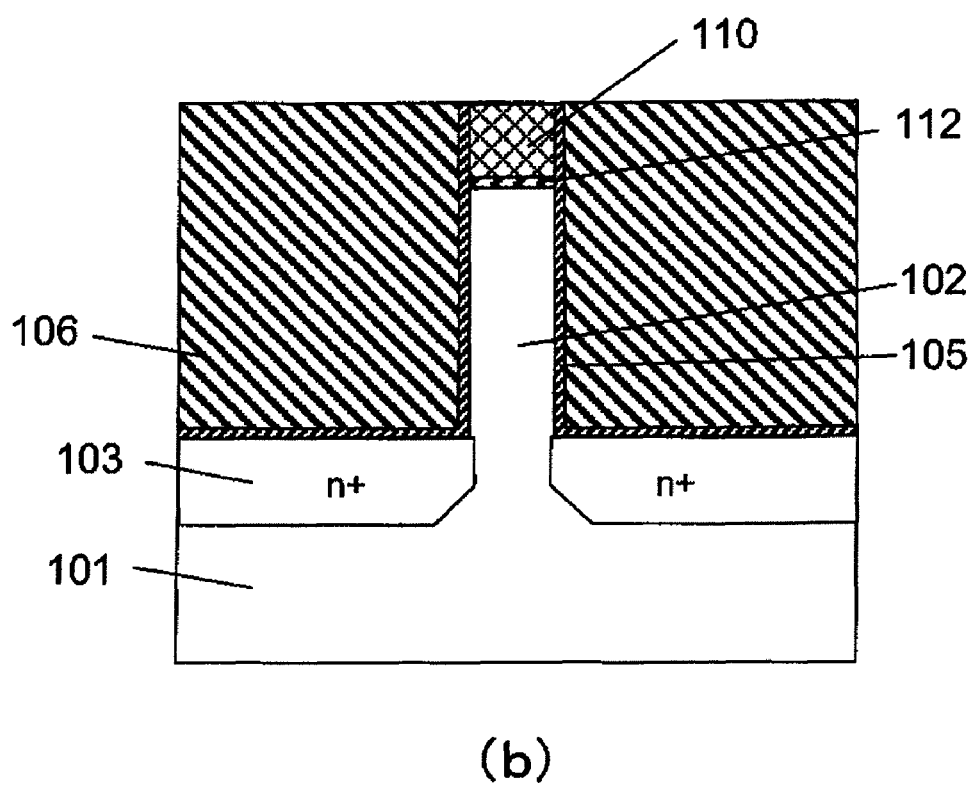
(b)

[Figure 8]
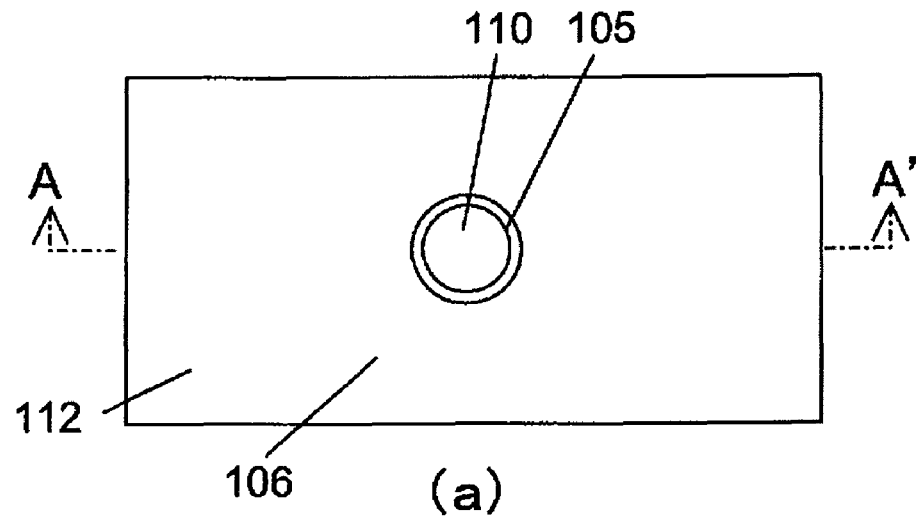
(a)
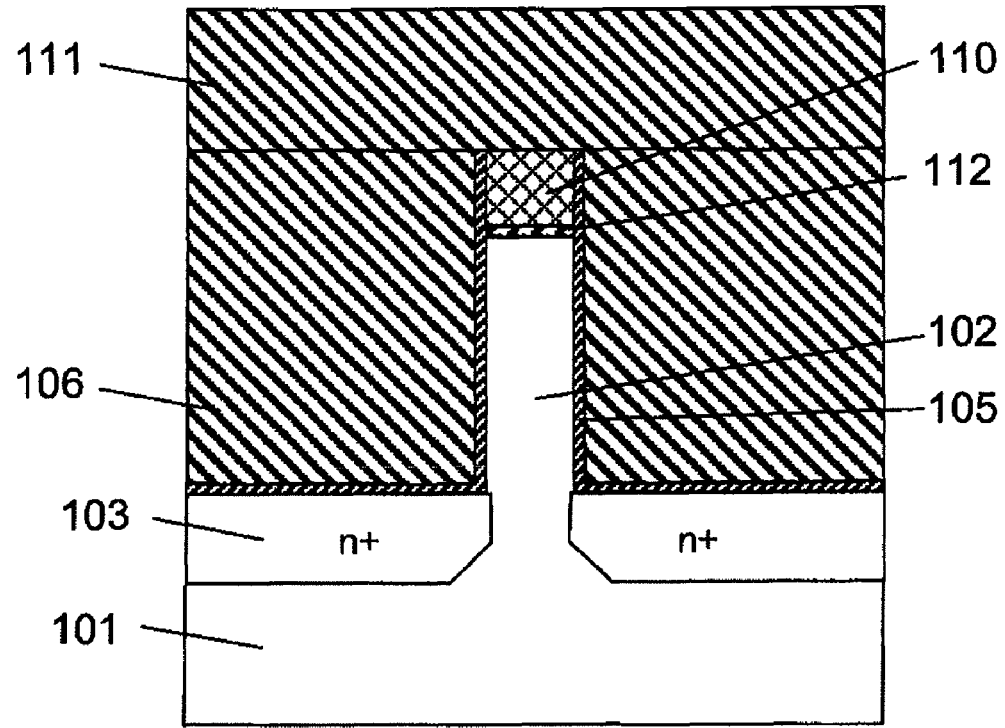
(b)

[Figure 9]
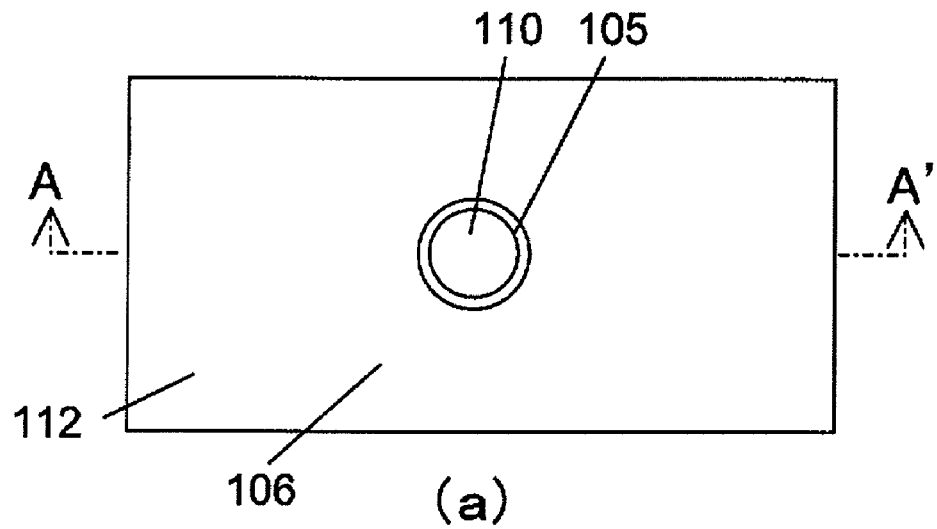
(a)
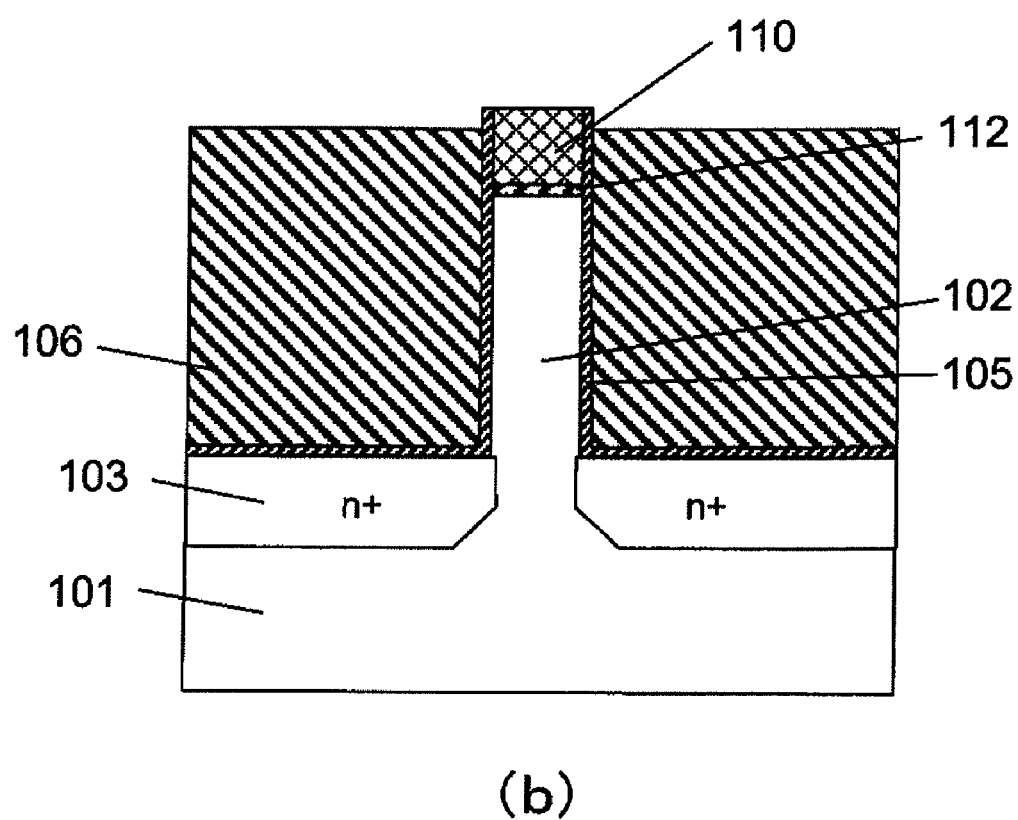
(b)

[Figure 10]
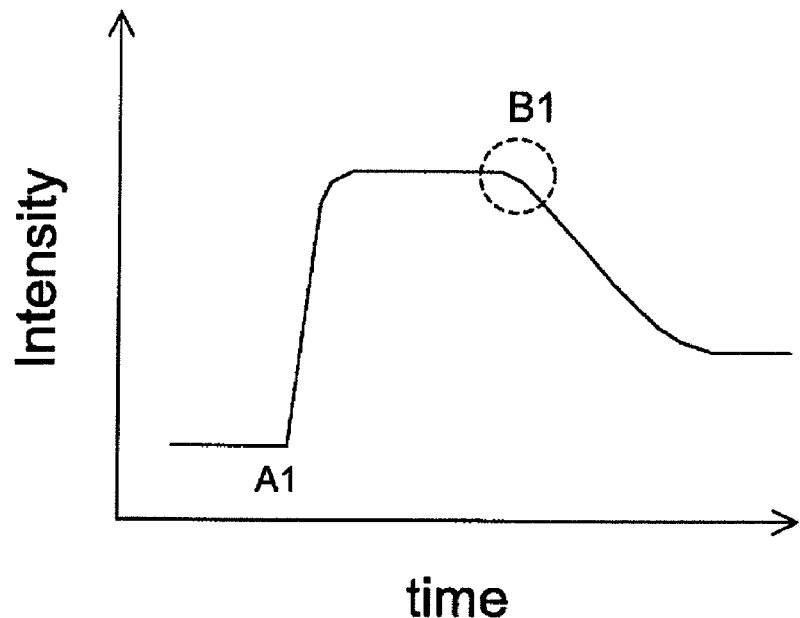
(a)
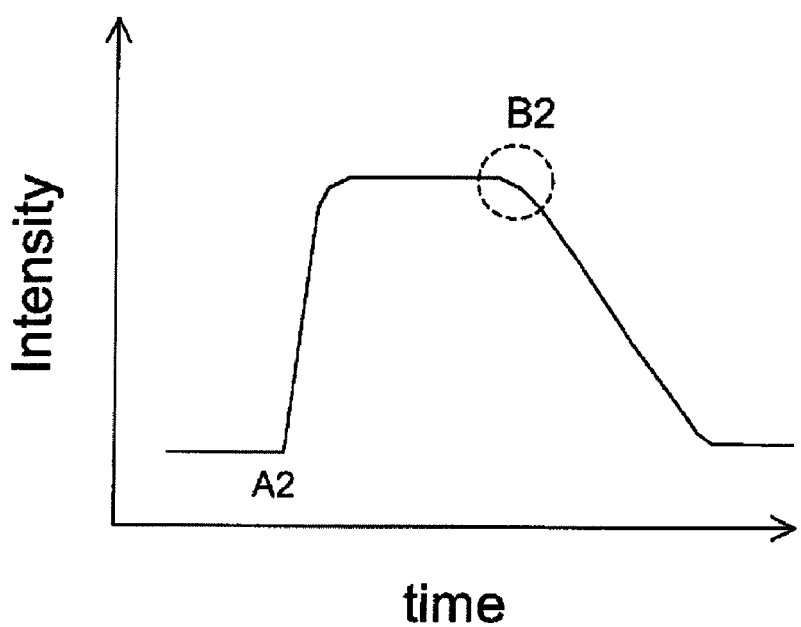
(b)

[Figure 11]
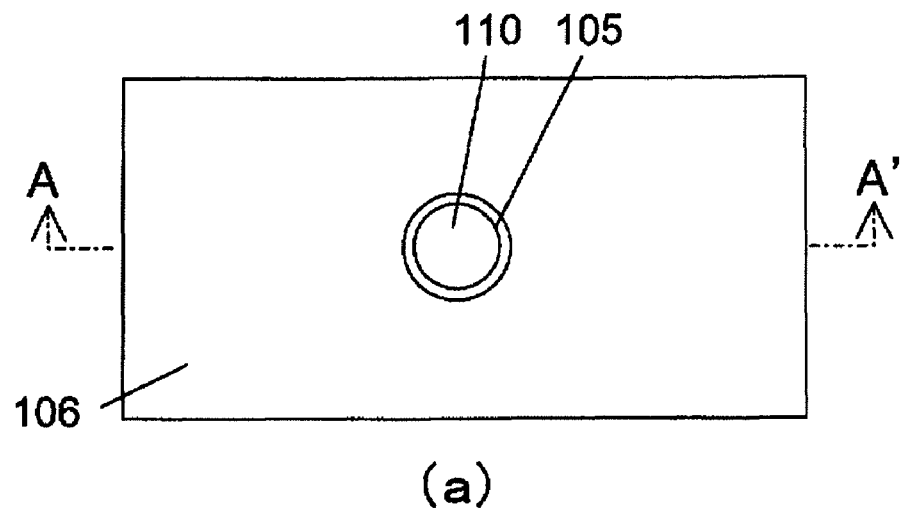
(a)
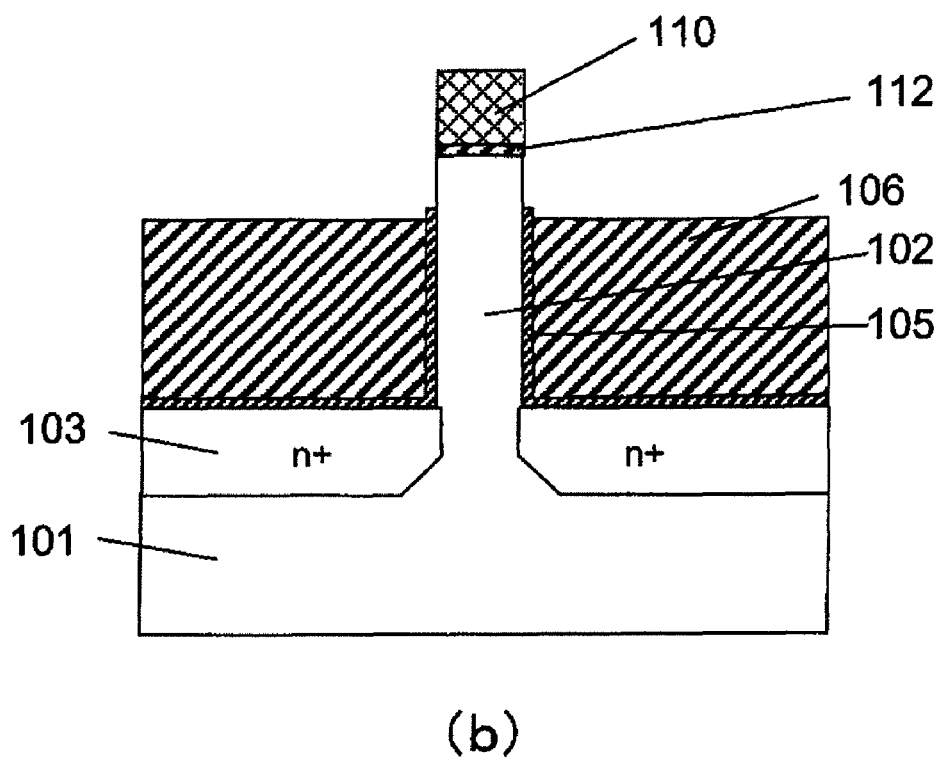
(b)

[Figure 12]
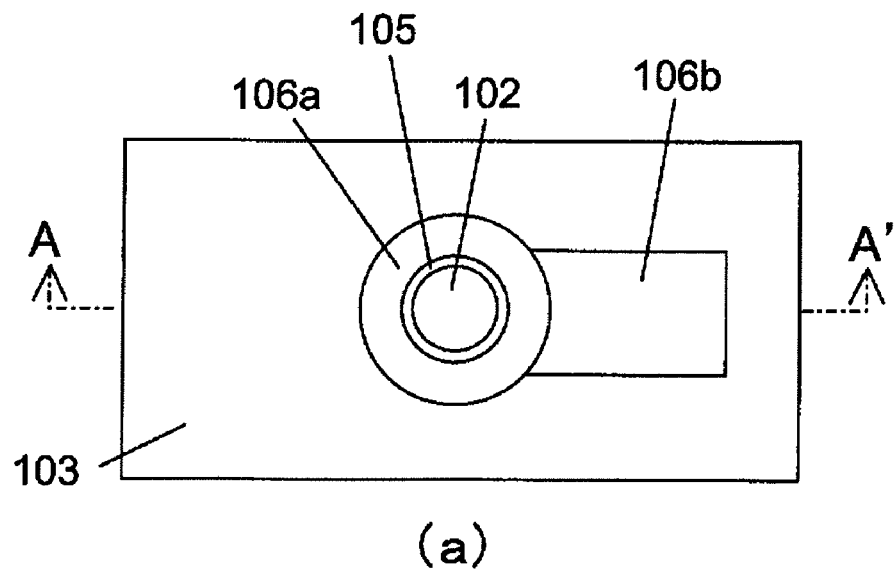
(a)
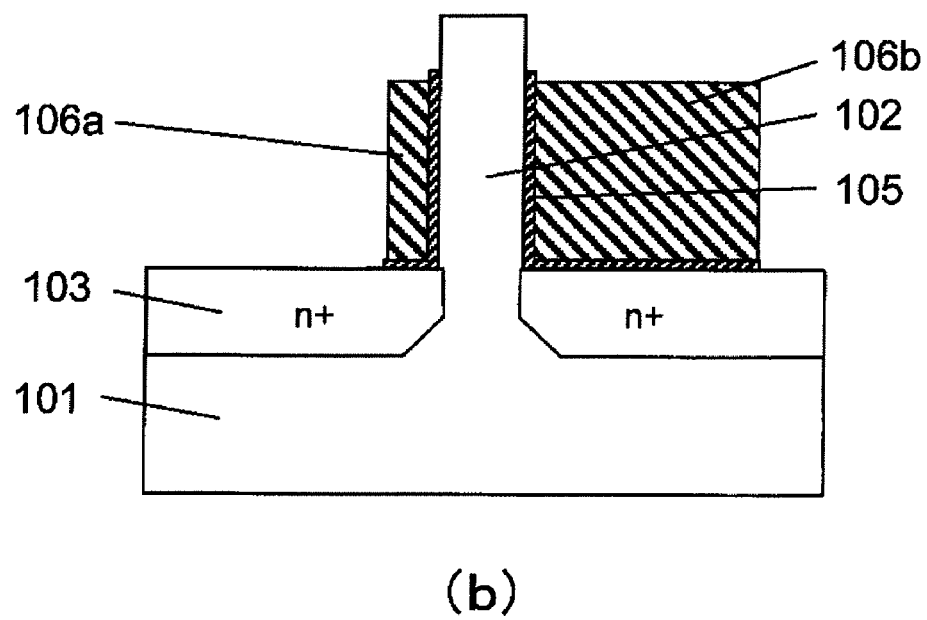
(b)

[Figure 13]
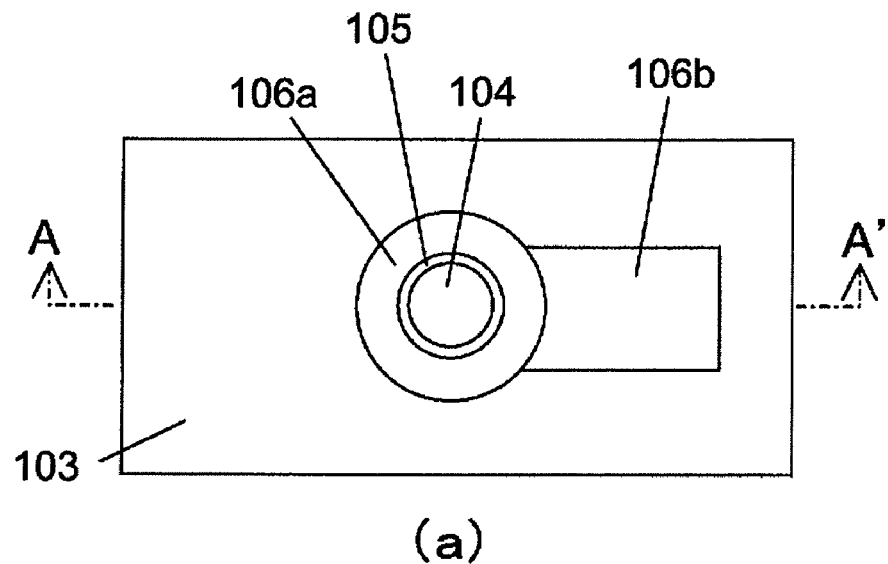
(a)
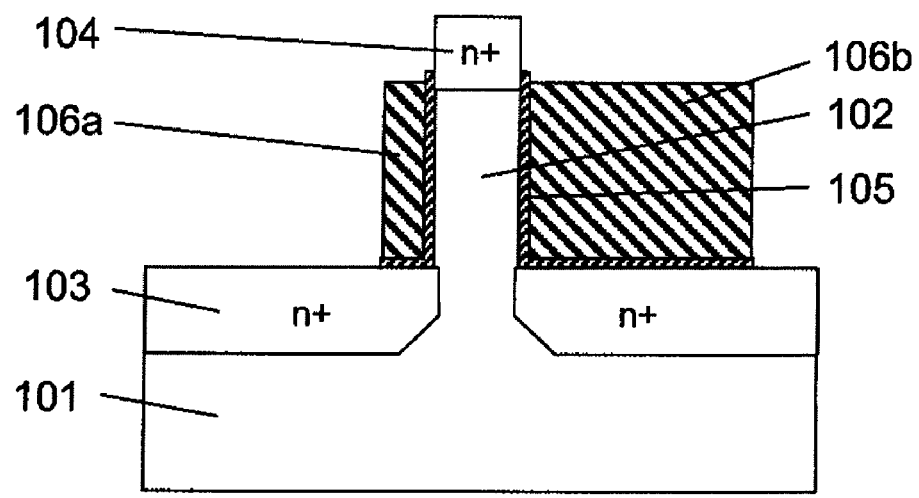
(b)

[Figure 14]
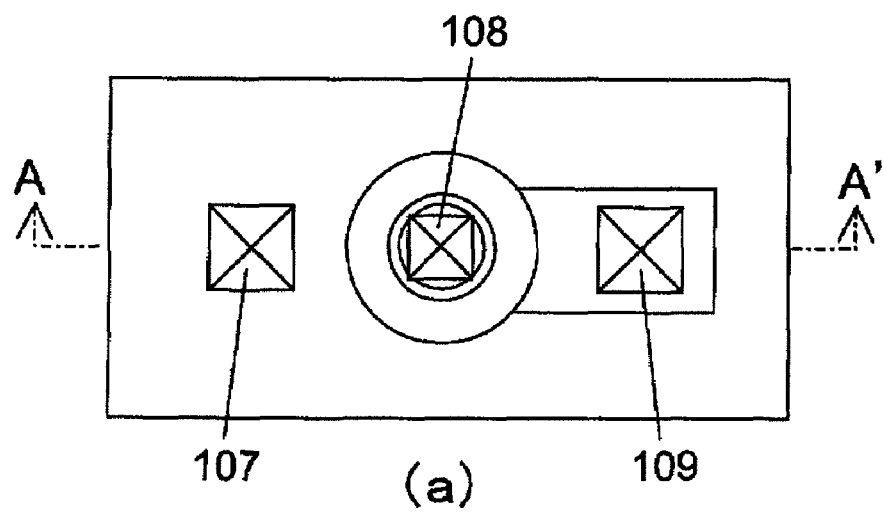
(a)
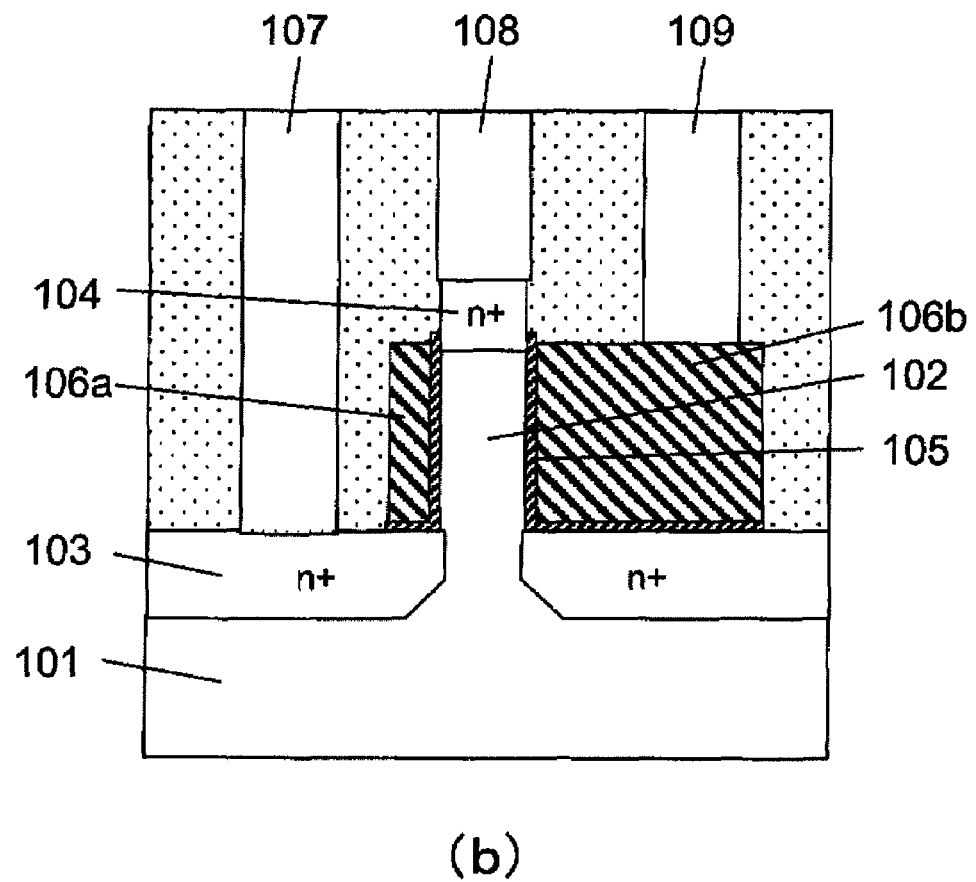
(b)

[Figure 15]
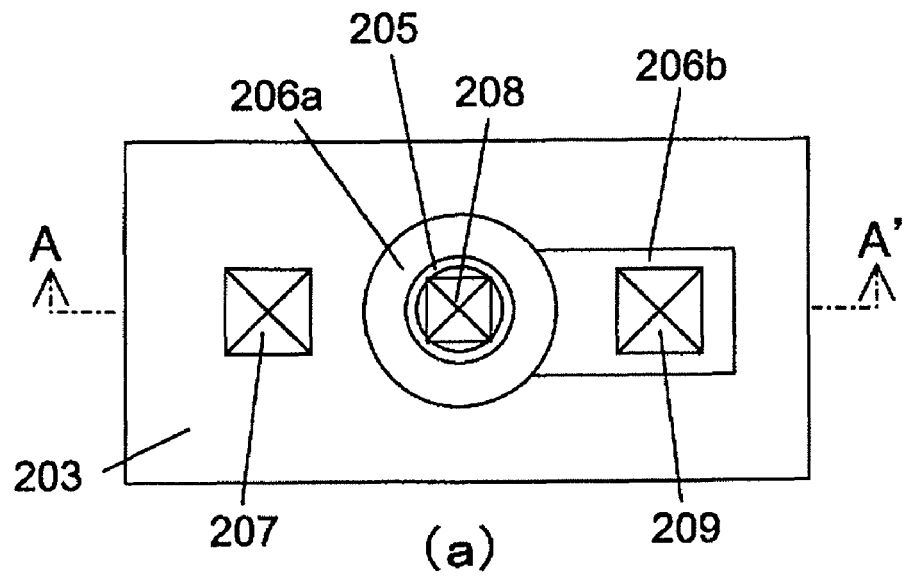
(a)
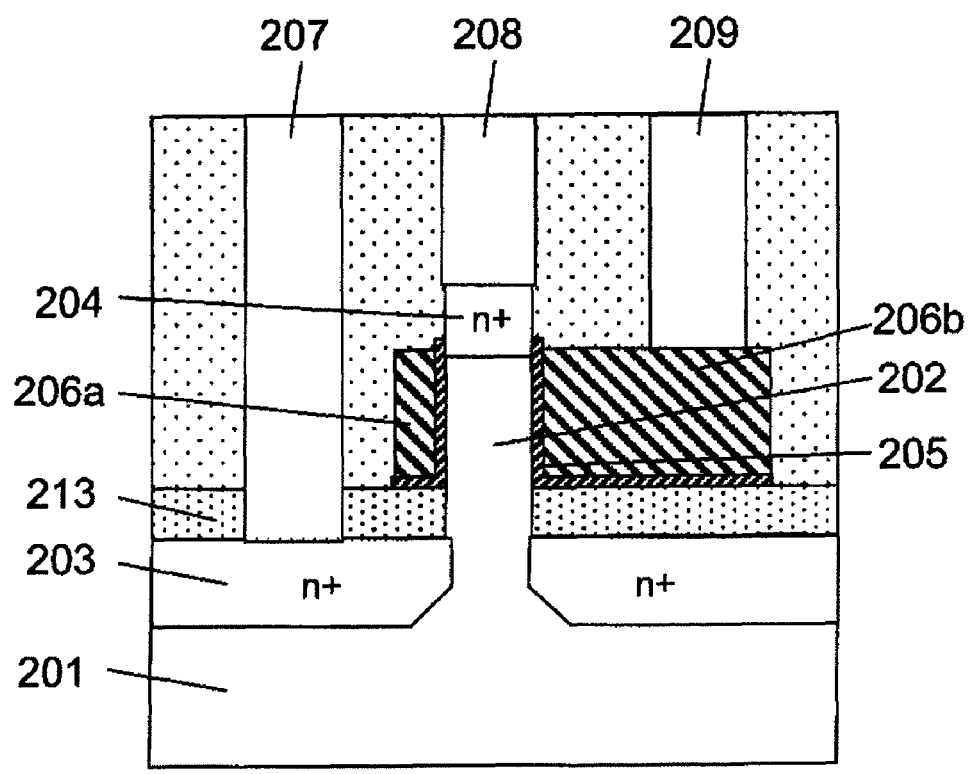
(b)

[Figure 16]
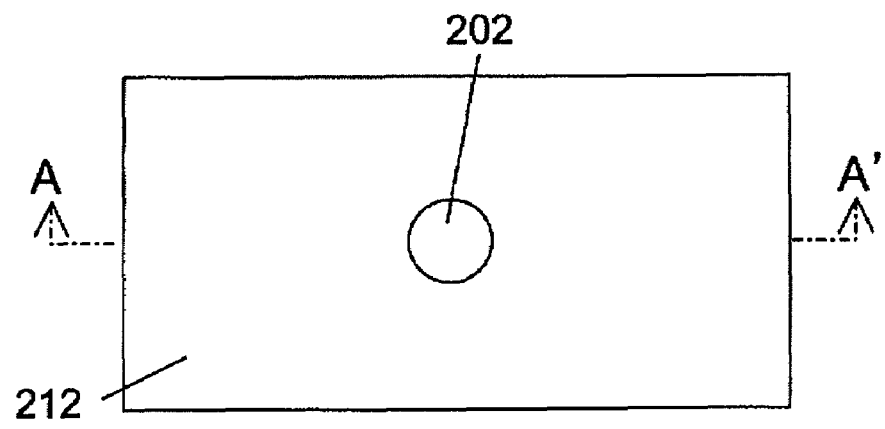
(a)
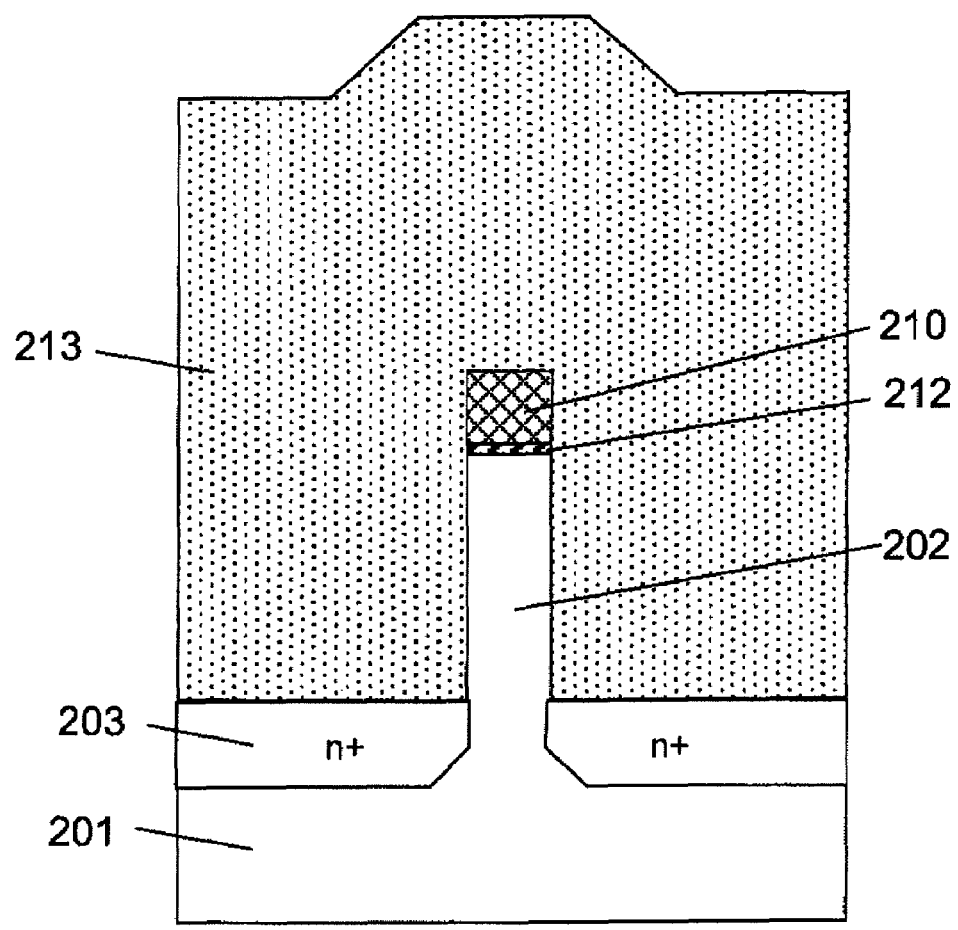
(b)

【Figure 17】
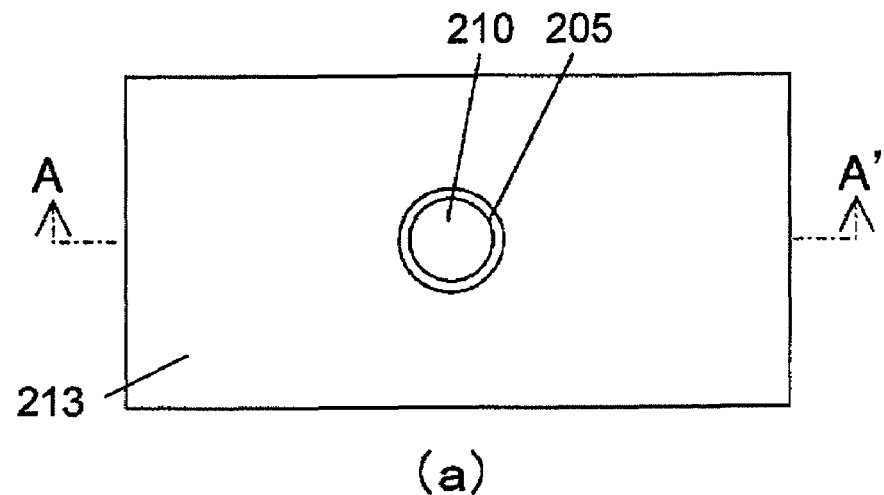
(a)
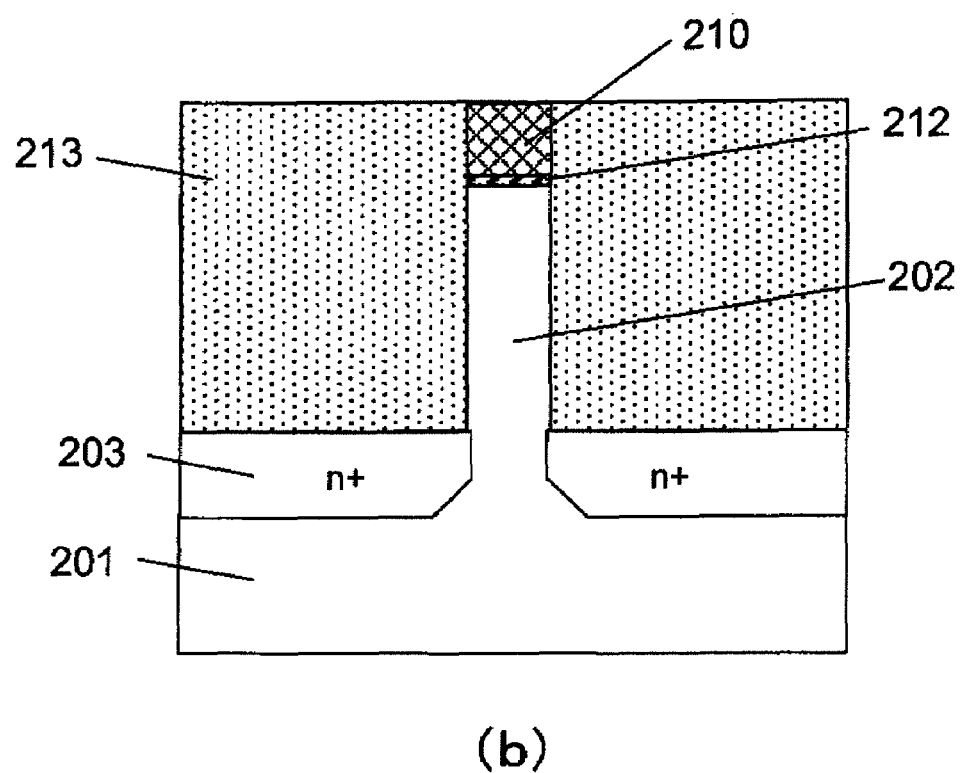
(b)

【Figure 18】
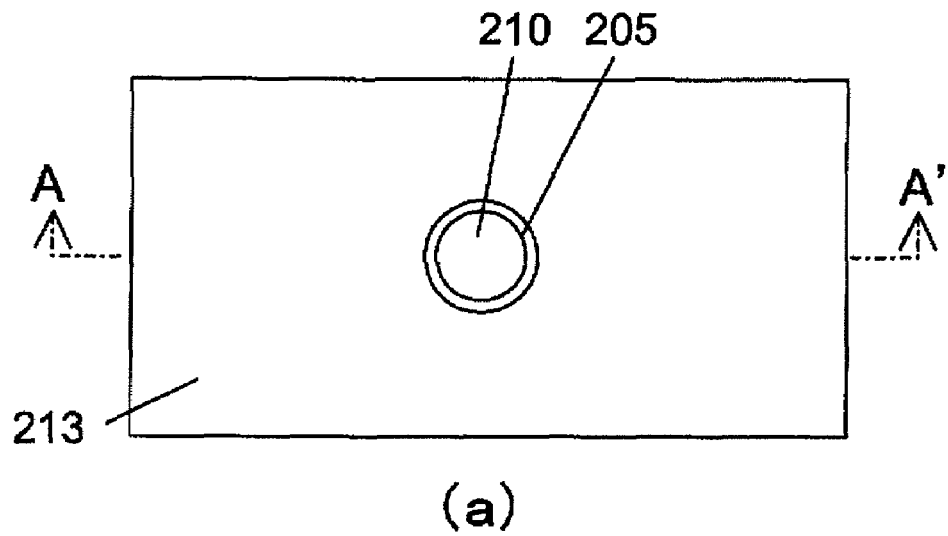
(a)
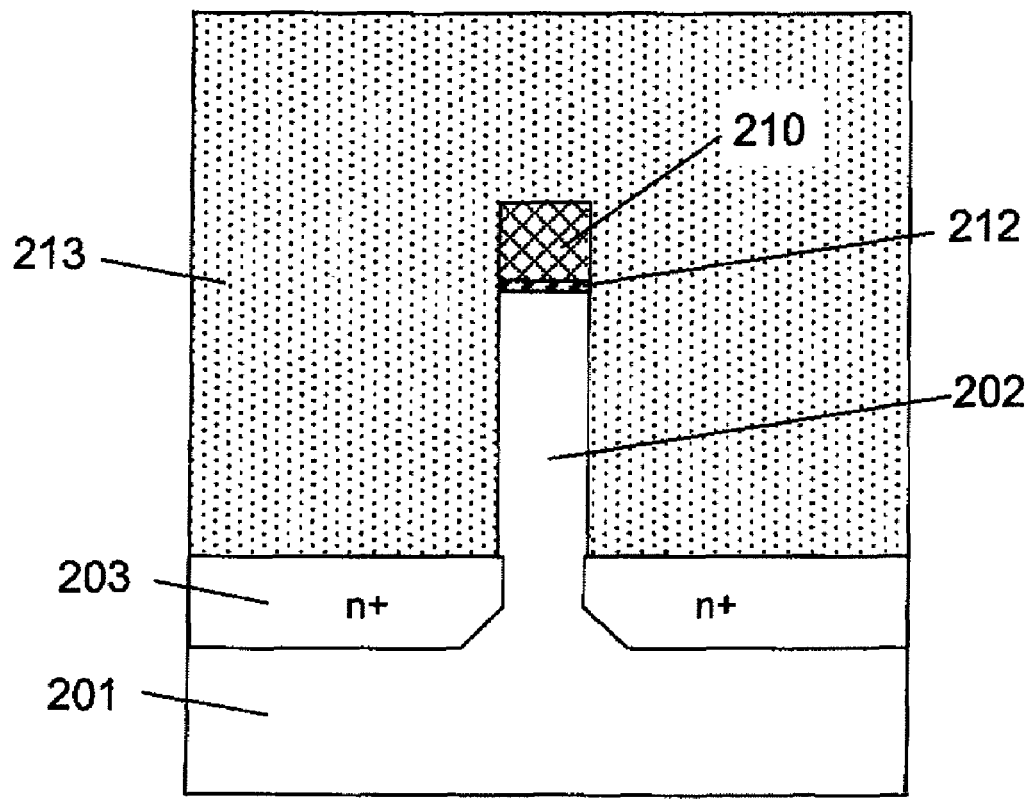
(b)

[Figure 19]
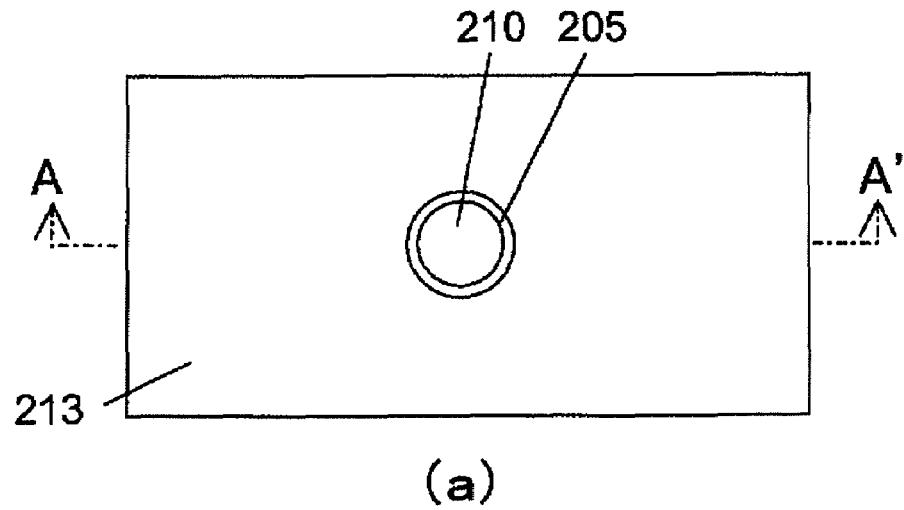
(a)
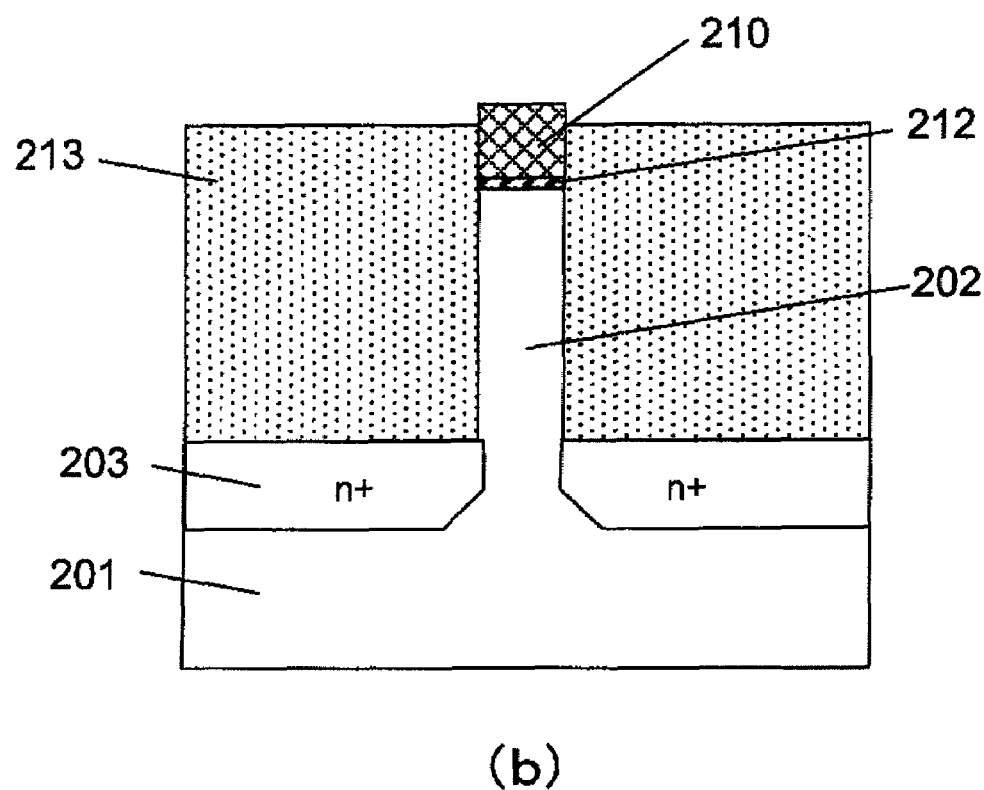
(b)

[Figure 20]
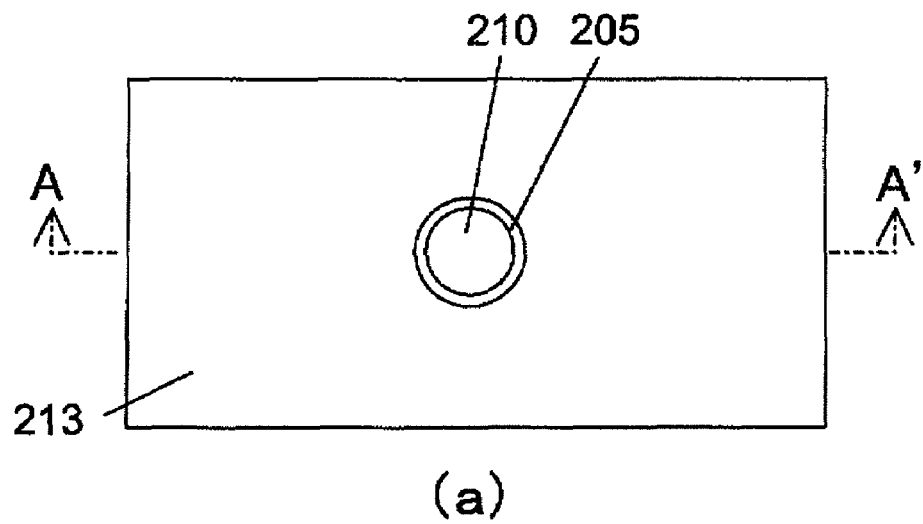
(a)
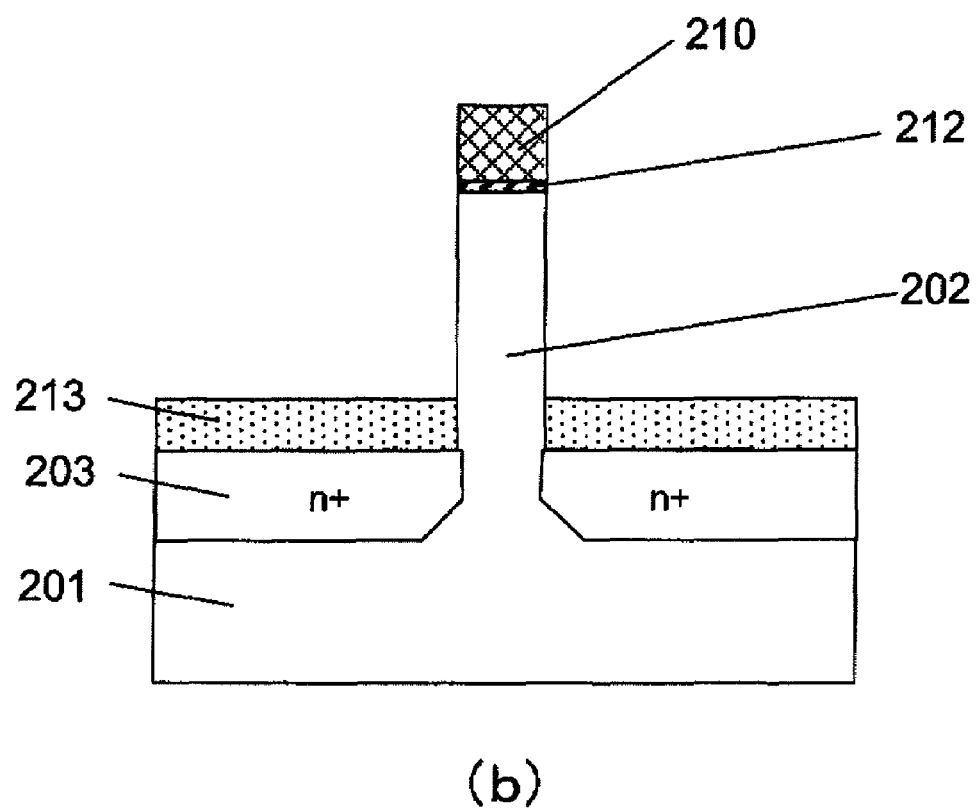
(b)

[Figure 21]
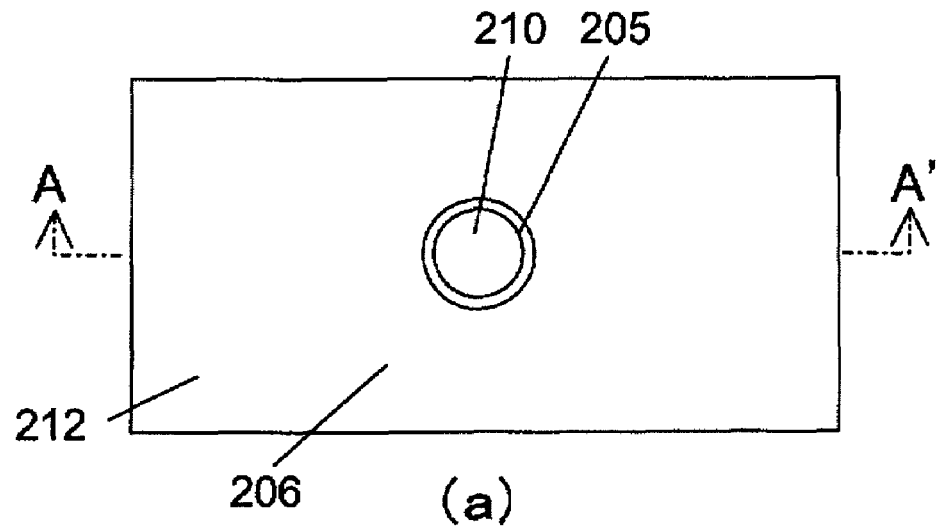
(a)
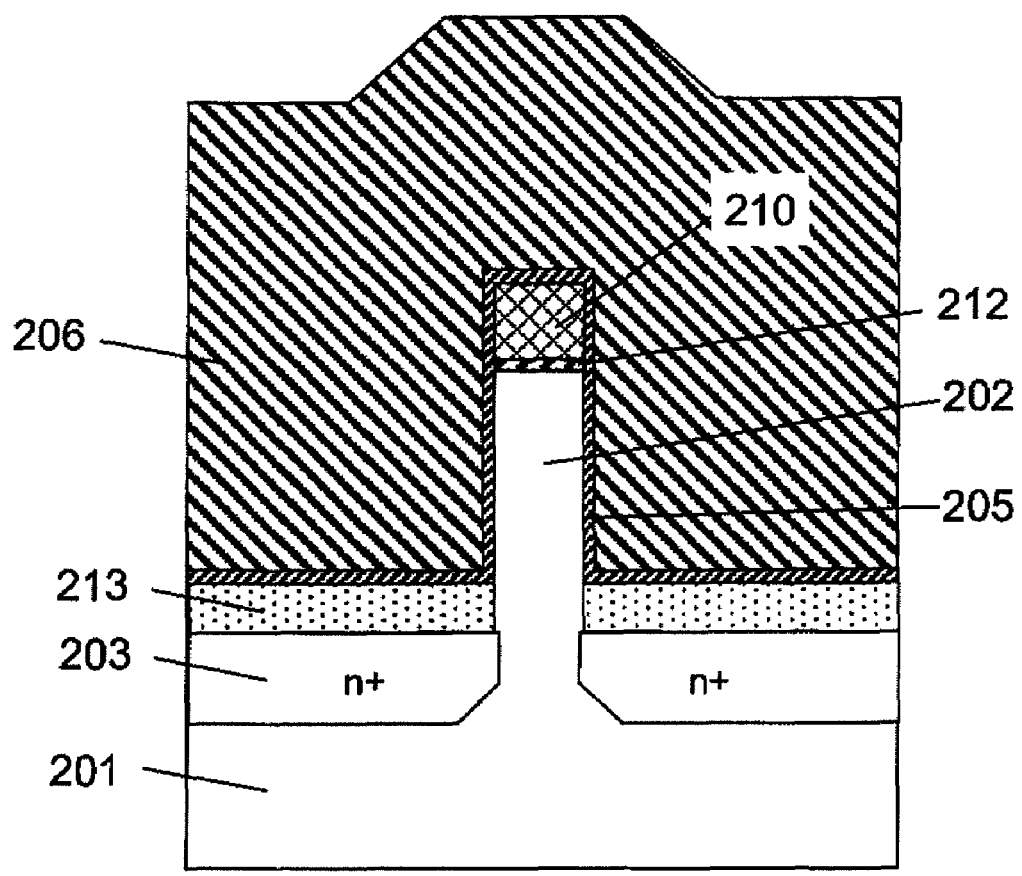
(b)

[Figure 22]
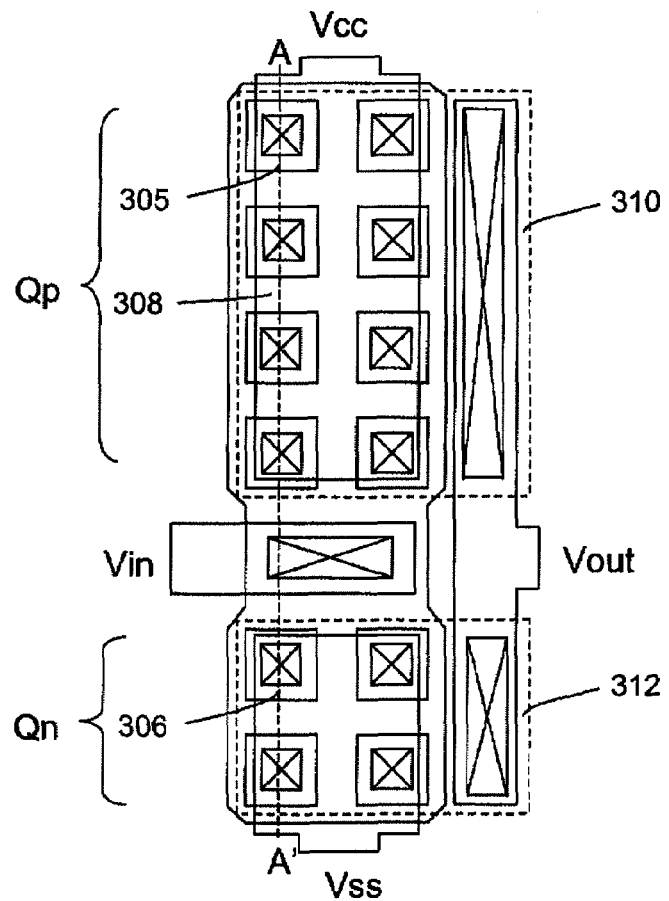
(a)
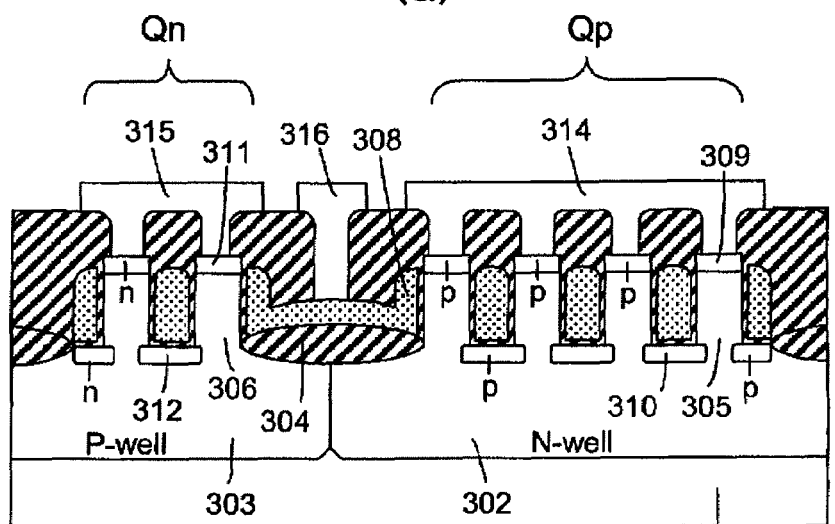
(b)

[Figure 23]
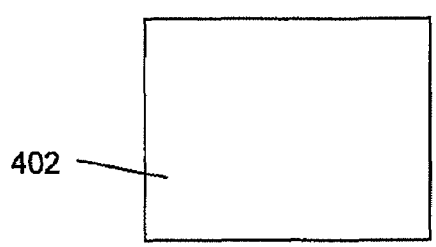
(a)
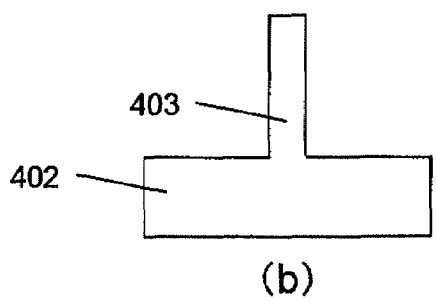
(b)
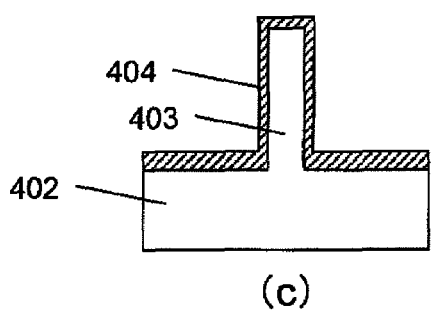
(c)
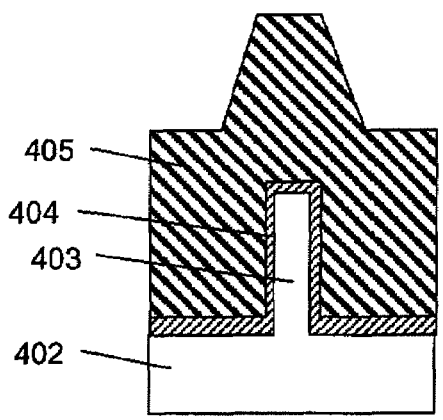
(d)
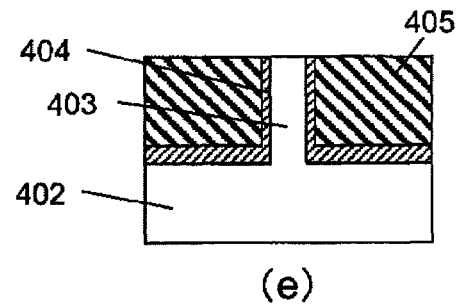
(e)
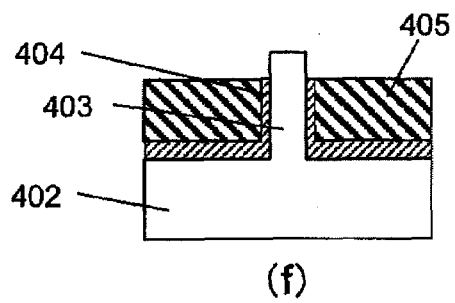
(f)
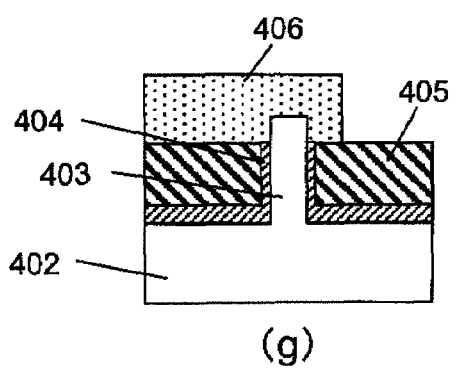
(g)
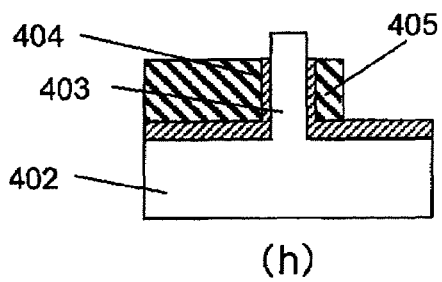
(h)

METHOD OF PRODUCING SEMICONDUCTOR DEVICE

RELATED APPLICATIONS

Pursuant to 35 U.S.C. §119(e), this document claims the benefit of the filing date of Provisional U.S. Patent Application Ser. No. 61/207,635 filed on Feb. 13, 2009. This application also claims priority under 35 U.S.C. §365(a) to PCT/JP2008/065718 filed on Sep. 2, 2008. The entire contents of which are hereby incorporated by reference.

BACKGROUND OF THE INVENTION

1. Technical Field

The present invention relates to a method of producing a semiconductor device, and more particularly to a structure and a production method for an SGT (Surrounding Gate Transistor) which is a vertical MOS transistor comprising a pillar-shaped semiconductor layer having a sidewall serving as a channel region, and a gate electrode formed to surround the channel region.

2. Background Art

With a view to achieving higher integration and higher performance of a semiconductor device, an SGT (Surrounding Gate Transistor) has been proposed which is a vertical transistor comprising a pillar-shaped semiconductor layer formed on a surface of a semiconductor substrate, and a gate formed to surround a sidewall of the pillar-shaped semiconductor layer (see Patent Document 1: JP 2-188966A). In the SGT, a source, a gate and a drain are arranged in a vertical direction, so that an occupancy area can be significantly reduced as compared with a conventional planar transistor.

FIG. 22(a) shows a top plan view of a CMOS inverter configured using the SGT disclosed in the Patent Document 1, and FIG. 22(b) is a sectional view taken along the cutting-plane line A-A' in the top plan view of FIG. 22(a).

Referring to FIGS. 22(a) and 22(b), an N-well 302 and a P-well 303 are formed in an upper region of a Si substrate 301. A pillar-shaped silicon layer 305 forming a PMOS (PMOS-forming pillar-shaped silicon layer 305) and a pillar-shaped silicon layer 306 forming an NMOS (NMOS-forming pillar-shaped silicon layer 306) are formed on a surface of the Si substrate, specifically on respective ones of the N-well region and the P-well region, and a gate 308 is formed to surround the pillar-shaped silicon layers. Then, each of a $P^+$ drain diffusion layer 310 formed beneath the PMOS-forming pillar-shaped silicon layer, and a $N^+$ drain diffusion layer 312 formed beneath the NMOS-forming pillar-shaped silicon layer, is connected to an output terminal Vout. A source diffusion layer 309 formed on a top of the PMOS-forming pillar-shaped silicon layer is connected to a power supply potential Vcc, and a source diffusion layer 311 formed on a top of the NMOS-forming pillar-shaped silicon layer is connected to a ground potential Vss. Further, the gate 308 common to the PMOS and the NMOS is connected to an input terminal Vin. In this manner, the CMOS inverter is formed.

As one example of an SGT production method, a process flow is disclosed in the following Non-Patent Document 1. FIG. 23 show a schematic process flow for forming a pillar-shaped silicon layer and a gate electrode in an SGT disclosed in the Non-Patent Document 1. The following description will be made about this process flow. As shown in FIG. 23(b), a silicon substrate 402 illustrated in FIG. 23(a) is etched to form a pillar-shaped silicon layer 403. Then, as shown in FIG. 23(c), a gate dielectric film 404 is formed. Then, as shown in FIG. 23(d), a gate conductive film 405 is formed. Then, as shown in FIG. 23(e), the gate conductive film 405, and a portion of the gate dielectric film 404 on a top of the pillar-shaped silicon layer, are polished by chemical mechanical polishing (CMP). Then, as shown in FIG. 23(f), the gate conductive film 405 is etched back in such a manner that the gate conductive film 405 surrounding the pillar-shaped silicon layer is fabricated to have a desired gate length. Then, as shown in FIG. 23(g), a resist 406 for a gate line pattern is formed by lithography. Then, as shown in FIG. 23(h), the gate conductive film 405 is etched to form a gate electrode and a gate line.

Patent Document 1: JP 2-188966A

Non-Patent Document 1: Ruigang Li, et al., "50 nm Vertical Surround Gate MOSFET with S-Factor of 75 mV/dec", Device Research Conference, 2001, p. 63.

However, the SGT production method illustrated in FIG. 23 has the following problem. During dry etching for forming a gate electrode in the above process flow, an etching end-point has to be based on a designated etching time, because it is unable to employ an end-point detection process based on monitoring a change in plasma emission intensity. In this case, during the dry etching, a variation in etching rate of an etching apparatus in each lot or in each wafer has a direct impact on gate length to cause a significantly large variation in gate length. The larger variation in gate length undesirably leads to a larger variation in transistor characteristics.

Thus, in order to reduce a variation in SGT characteristics, it is essential to employ an end-point detection process capable of absorbing the variation in etching rate in each lot or in each wafer.

In view of the above circumstances, it is an object of the present invention to produce an SGT with a stable gate length, using an end-point detection process based on monitoring a plasma emission intensity during dry etching for setting a gate length.

SUMMARY OF THE INVENTION

In order to achieve the above object, according to one aspect of the present invention, there is provided a method of producing a semiconductor device in which a source diffusion layer, a drain diffusion layer and a pillar-shaped semiconductor layer are vertically arranged on an upper side of a substrate in a layered manner, and a gate is arranged around a sidewall of the pillar-shaped semiconductor layer, wherein the pillar-shaped semiconductor layer is provided on a semiconductor substrate, and a dielectric film is provided on respective surfaces of the semiconductor substrate and the pillar-shaped semiconductor layer. The method comprises the steps of: forming a first gate conductive film to cover respective surfaces of the pillar-shaped semiconductor layer and a hard mask formed on top of the pillar-shaped semiconductor layer; flattening an upper portion of the first gate conductive film using the hard mask as a stopper; forming a second gate conductive film on a surface of the flattened first gate conductive film; anisotropically etching the second gate conductive film; monitoring an intensity of plasma emission from the second gate conductive film during the etching, to detect an end-point of the etching of the second gate conductive film, based on a change in the plasma emission intensity; and anisotropically etching the first gate conductive film, wherein an etching rate of the first gate conductive film is determined based on an etching rate of the second gate conductive film calculated from a film thickness of the second gate conductive film and a time taken from initiation to completion of the etching of the second gate conductive film, and a relative ratio between respective etching rates of the first and second gate conductive films, to detect an end-point of the etching of the first gate conductive film.

In a preferred embodiment of the present invention, each of the first gate conductive film and the second gate conductive film is made of polysilicon. In another preferred embodiment of the present invention, the first gate conductive film and the second gate conductive film are made of a same metal material. In yet another preferred embodiment of the present invention, the first gate conductive film and the second gate conductive film are made of different metal materials, respectively.

According to another aspect of the present invention, there is provided a method of producing a semiconductor device in which a source diffusion layer, a drain diffusion layer and a pillar-shaped semiconductor layer are vertically arranged on an upper side of a substrate in a layered manner, and a gate is arranged around a sidewall of the pillar-shaped semiconductor layer, wherein the pillar-shaped semiconductor layer is provided on a semiconductor substrate. The method comprises the steps of: forming a first dielectric film to cover respective surfaces of the pillar-shaped semiconductor layer and a hard mask formed on top of the pillar-shaped semiconductor layer; flattening an upper portion of the first dielectric film using the hard mask as a stopper; forming a second dielectric film on a surface of the flattened first dielectric film; anisotropically etching the second dielectric film; monitoring an intensity of plasma emission from the second dielectric film during the etching, to detect an end-point of the etching of the second dielectric film, based on a change in the plasma emission intensity; and anisotropically etching the first dielectric film, wherein an etching rate of the first dielectric film is determined based on an etching rate of the second dielectric film calculated from a film thickness of the second dielectric film and a time taken from initiation to completion of the etching of the second dielectric film, and a relative ratio between respective etching rates of the first and second dielectric films, to detect an end-point of the etching of the first dielectric film.

In a preferred embodiment of the present invention, each of the first dielectric film and the second dielectric film is made of a silicon oxide.

BRIEF DESCRIPTION OF THE DRAWINGS

FIGS. 1(a) and 1(b) are, respectively, a top plan view and a sectional view of an SGT produced by a method according to a first embodiment of the present invention.

FIGS. 2(a) and 2(b) are process flow diagrams showing the production method according to the first embodiment, in order of process sequence.

FIGS. 3(a) and 3(b) are process flow diagrams showing the production method according to the first embodiment, in order of process sequence.

FIGS. 4(a) and 4(b) are process flow diagrams showing the production method according to the first embodiment, in order of process sequence.

FIGS. 5(a) and 5(b) are process flow diagrams showing the production method according to the first embodiment, in order of process sequence.

FIGS. 6(a) and 6(b) are process flow diagrams showing the production method according to the first embodiment, in order of process sequence.

FIGS. 7(a) and 7(b) are process flow diagrams showing the production method according to the first embodiment, in order of process sequence.

FIGS. 8(a) and 8(b) are process flow diagrams showing the production method according to the first embodiment, in order of process sequence.

FIGS. 9(a) and 9(b) are process flow diagrams showing the production method according to the first embodiment, in order of process sequence.

FIGS. 10(a) and 10(b) are graphs each showing a characteristic curve of plasma emission intensity in the production method according to the first embodiment.

FIGS. 11(a) and 11(b) are process flow diagrams showing the production method according to the first embodiment, in order of process sequence.

FIGS. 12(a) and 12(b) are process flow diagrams showing the production method according to the first embodiment, in order of process sequence.

FIGS. 13(a) and 13(b) are process flow diagrams showing the production method according to the first embodiment, in order of process sequence.

FIGS. 14(a) and 14(b) are process flow diagrams showing the production method according to the first embodiment, in order of process sequence.

FIGS. 15(a) and 15(b) are, respectively, a top plan view and a sectional view of an SGT produced by a method according to a second embodiment of the present invention.

FIGS. 16(a) and 16(b) are process flow diagrams showing the production method according to the second embodiment, in order of process sequence.

FIGS. 17(a) and 17(b) are process flow diagrams showing the production method according to the second embodiment, in order of process sequence.

FIGS. 18(a) and 18(b) are process flow diagrams showing the production method according to the second embodiment, in order of process sequence.

FIGS. 19(a) and 19(b) are process flow diagrams showing the production method according to the second embodiment, in order of process sequence.

FIGS. 20(a) and 20(b) are process flow diagrams showing the production method according to the second embodiment, in order of process sequence.

FIGS. 21(a) and 21(b) are process flow diagrams showing the production method according to the second embodiment, in order of process sequence.

FIGS. 22(a) and 22(b) are, respectively, a top plan view and a sectional view of a conventional SGT.

FIGS. 23(a) to 23(h) are process flow diagrams showing a conventional SGT production method.

DETAILED DESCRIPTION OF THE PREFERRED EMBODIMENTS

The present invention will now be described based on an SGT production method according to an embodiment thereof, which is capable of detecting an etching end-point by monitoring a plasma emission intensity, during dry etching for forming a gate electrode.

First Embodiment

An SGT production method according to a first embodiment of the present invention provides a technique of, during dry etching for forming a gate conductive film to have a desired gate length, accurately controlling an etching amount of the gate conductive film, using an end-point detection process based on monitoring a plasma emission intensity.

FIG. 1(a) is a top plan view showing an NMOS SGT produced by the method according to the first embodiment, and FIG. 1(b) is a sectional view taken along the line A-A' in FIG. 1(a). With reference to FIGS. 1(a) and 1(b), the SGT produced by the method according to the first embodiment will be described below.

A pillar-shaped silicon layer 102 is formed on a silicon substrate 101, and a gate dielectric film 105 and a gate electrode 106a are formed around the pillar-shaped silicon layer 102. An $N^+$ drain diffusion layer 103 is formed beneath the pillar-shaped silicon layer 102, and an $N^+$ source diffusion layer 104 is formed on a top of the pillar-shaped silicon layer 102. A contact 107, a contact 108, and a contact 109, are formed on the $N^+$ drain diffusion layer 103, the $N^+$ source diffusion layer 104, and a gate line 106b extending from the gate electrode 106a, respectively.

Under conditions that the $N^+$ source diffusion layer 104 is connected to a GND potential, and the $N^+$ drain diffusion layer 103 is connected to a power supply voltage Vcc, a potential ranging from zero to Vcc is applied to the gate electrode 106a to allow the SGT to operate as a transistor. Practically, there is another type of SGT adapted to operate under a condition that the source diffusion layer and the drain diffusion layer are interchanged.

FIGS. 2(a) to 14(b) show one example of the SGT production method which allows for the etching for accurately forming a pillar-shaped silicon layer. In FIGS. 2(a) to 14(b), the figure suffixed by (a) is a top plan view, and the figure suffixed by (b) is a sectional view taken along the line A-A'.

As shown in FIGS. 2(a) and 2(b), a pad oxide film 112 is formed on a silicon substrate 101 to serve as a pad for reducing a stress between the silicon substrate and an after-mentioned hard mask. Subsequently, a silicon nitride film 110 is formed on the pad oxide film 112 to serve as a hard mask.

As shown in FIGS. 3(a) and 3(b), a resist is patterned by lithography using a mask for a pillar-shaped silicon layer, and the pad oxide film 112 and the hard mask 110 are patterned by dry etching.

As shown in FIGS. 4(a) and 4(b), the silicon substrate 101 is etched using the hard mask 110 to form a pillar-shaped silicon layer 102.

As shown in FIGS. 5(a) and 5(b), an $N^+$ diffusion layer 103 is formed in a diffusion region beneath the pillar-shaped silicon layer 102, by means of ion implantation or the like.

As shown in FIGS. 6(a) and 6(b), a gate dielectric film 105 is formed. Subsequently, a first gate conductive film 106 made of polysilicon is formed to allow the pillar-shaped silicon layer 102 to be buried therein.

As shown in FIGS. 7(a) and 7(b), respective portions of the first gate conductive film 106 and the gate dielectric film 105 above the pillar-shaped silicon layer 102 are polished by chemical mechanical polishing (CMP), to flatten a top surface of the first gate conductive film 106. The flattening of a top of the gate conductive film 106 by CMP facilitates control of a gate length, as described later. During the CMP, the hard mask 110 on top of the pillar-shaped silicon layer is used as a CMP stopper. A silicon nitride film may be used as the hard mask, as in the first embodiment. In this case, a selectivity ratio between the hard mask and the gate conductive film can be set to a large value to control a CMP amount with high repeatability.

As shown in FIGS. 8(a) and 8(b), a second gate conductive film 111 made of polysilicon is formed.

As shown in FIGS. 9(a) and 9(b), the second gate conductive film 111 is etched back. FIG. 9(b) shows a structure at a timing when an etching end-point is detected after the hard mask is exposed.

As shown in a characteristic curve of plasma emission intensity during the etching-back in FIG. 10(a), the plasma emission intensity sharply increases just after initiation of the etching (point A1). Then, when the hard mask starts being exposed, an amount of polysilicon to be etched decreases. Thus, the plasma emission intensity starts decreasing (point B1). An etching end-point can be detected by monitoring the above decrease in the plasma emission intensity. A film thickness of the second gate conductive film to be etched before the exposure of the hard mask depends on an amount of the second gate conductive film to be formed. Thus, an etching rate of the second gate conductive film 111 can be calculated based on the film thickness of the second gate conductive and a time taken from initiation to completion of the etching. In this regard, the top of the first conductive film 106 flattened by polishing in advance as described above makes it possible to accurately determine an etched amount and an etching time of the second gate conductive film so as to accurately calculate an etching rate of the second gate conductive film. This etching rate can be used to calculate an overetching amount for a desired film thickness in consideration of an etching rate during etching of the first gate conductive film, so that a gate length can be set in a stable manner. Specifically, an etching rate for actually etching the first gate conductive film can be calculated, based on an etching rate of the second gate conductive film calculated during actual etching of the second gate conductive film, and a relative ratio between respective etching rates of the first and second gate conductive films. Then, an etching time required for allowing the first gate conductive film to have a desired film thickness can be accurately obtained based on the above etching rate of the first gate conductive film.

The hard mask 110 on top of the pillar-shaped silicon layer also has a function of protecting the pillar-shaped silicon layer from being etched during the above etching.

In the first embodiment, each of the first gate conductive film and the second gate conductive film is made of polysilicon. Alternatively, the first gate conductive film and the second gate conductive film may be made of the same metal material.

Also, the first gate conductive film and the second gate conductive film may be made of the different metal material. In the case where the first gate conductive film and the second gate conductive film are made of different metal material, an intensity of plasma emission from the second gate conductive film has a characteristic curve as shown in FIG. 10(b). Specifically, the plasma emission intensity sharply increases just after initiation of the etching (point A2). Then, when the hard mask is exposed, the second gate conductive film is fully etched away. Thus, the plasma emission intensity starts decreasing (point B2). An etching end-point can be detected by monitoring the above decrease in the plasma emission intensity.

Regardless of whether the first gate conductive film and the second gate conductive film are made of the same material or made of different materials, respectively, an etching amount of the first gate conductive film can be controlled in the same manner, as long as a relative ratio between respective etching rates of the first and second gate conductive films can be found out.

As described above, an etching time of the first gate conductive film is determined based on an accurate etching rate of the first gate conductive film. Thus, after completion of dry etching, the gate conductive film is formed to have a desired gate length for a gate electrode, as shown in FIGS. 11(a) and 11(b).

As shown in FIGS. 12(a) and 12(b), the pad oxide film 112 and the hard mask 110 is removed by dry etching or wet etching. Subsequently, the gate conductive film is patterned to form a gate electrode 106a surrounding the pillar-shaped silicon layer, and a gate line 106b on which a contact is to be formed.

As shown in FIGS. 13(a) and 13(b), an N⁺ source diffusion layer 104 is formed in an upper portion of the pillar-shaped silicon layer, by means of ion implantation or the like.

As shown in FIGS. 14(a) and 14(b), an interlayer film is formed, and a contact (107, 108, 109) is formed. In the above manner, an SGT is formed.

Second Embodiment

An SGT production method according to a second embodiment of the present invention provides a technique of, during dry etching for forming a silicon oxide film to have a desired thickness for reducing a gate capacitance in such a manner as to be interposed between a gate electrode and a portion of a substrate beneath a pillar-shaped silicon layer, accurately controlling an etching amount of the silicon oxide film, using an end-point detection process based on monitoring a plasma emission intensity.

FIG. 15(a) is a top plan view showing an NMOS SGT produced by the method according to the second embodiment, and FIG. 15(b) is a sectional view taken along the line A-A' in FIG. 15(a). With reference to FIGS. 15(a) and 15(b), the SGT produced by the method according to the second embodiment will be described below.

A pillar-shaped silicon layer 202 is formed on a silicon substrate 201, and a gate dielectric film 205 and a gate electrode 206a are formed around the pillar-shaped silicon layer 202. An N⁺ drain diffusion layer 203 is formed beneath the pillar-shaped silicon layer 202, and an N⁺ source diffusion layer 204 is formed on a top of the pillar-shaped silicon layer 202. A silicon oxide film 213 is formed between the N⁺ drain diffusion layer 203 and the gate electrode 206a to reduce a gate capacitance. A contact 207, a contact 208, and a contact 209, are formed on the N⁺ drain diffusion layer 203, the N⁺ source diffusion layer 204, and a gate line 206b extending from the gate electrode 206a, respectively. The silicon oxide film 213 has a small film thickness of several tens of nm. Thus, it is necessary to accurately control the film thickness.

Under conditions that the N⁺ source diffusion layer 204 is connected to a GND voltage, and the N⁺ drain diffusion layer 203 is connected to a power supply potential Vcc, a voltage ranging from zero to Vcc is applied to the gate electrode 206a to allow the SGT to operate as a transistor. Practically, there is another type of SGT adapted to operate under a condition that the source diffusion layer and the drain diffusion layer are interchanged.

FIGS. 16(a) to 21(b) show one example of the SGT production method. In FIGS. 16(a) to 21(b), the figure suffixed by (a) is a top plan view, and the figure suffixed by (b) is a sectional view taken along the line A-A'. In the second embodiment, the step of forming an N⁺ drain diffusion layer (see FIGS. 5(a) and 5(b)) and any step therebefore are the same as those in the first embodiment. Thus, the following description will be made about steps subsequent to the N⁺ drain diffusion layer forming step.

As shown in FIGS. 16(a) and 16(b), a silicon oxide film 213 is formed to allow a pillar-shaped silicon layer 202 to be buried therein.

As shown in FIGS. 17(a) and 17(b), a portion of the silicon oxide film 213 above the pillar-shaped silicon layer are polished by CMP, to flatten a top surface of the silicon oxide film. During the CMP, a hard mask 210 on top of the pillar-shaped silicon layer is used as a CMP stopper. A silicon nitride film may be used as the hard mask. In this case, a selectivity ratio between the hard mask and the silicon oxide film can be set to a large value to control a CMP amount with high repeatability.

As shown in FIGS. 18(a) and 18(b), a silicon oxide film 213 is formed to allow the pillar-shaped silicon layer 202 to be buried therein.

As shown in FIGS. 19(a) and 19(b), the silicon oxide film is etched back. FIG. 19(b) shows a structure at a timing when an etching end-point is detected after the silicon nitride film serving as the hard mask is exposed. An algorism for use in the end-point detection is the same as that (see FIG. 10(a)) in the first embodiment.

In the operation of etching back the silicon oxide film, an etching rate of the silicon oxide film 213 is calculated, and an etching time required for allowing the silicon oxide film to have a desired film thickness is determined based on the calculated etching rate, in the same manner as that in the first embodiment. Thus, after completion of dry etching, the silicon oxide film 213 is formed on the N⁺ drain diffusion layer 203 to have a desired film thickness for reducing a gate capacitance, as shown in FIGS. 20(a) and 20(b).

As shown in FIGS. 21(a) and 21(b), a gate dielectric film 205 and a gate conductive film 206 are formed. Subsequent steps are the same as those in the first embodiment, and their description will be omitted here.

The present invention is not limited to the above embodiments, but encompasses any other SGT production method which comprises the steps of: forming a first dielectric or gate conductive film to allow a pillar-shaped semiconductor layer to be buried therein; flattening the first dielectric or gate conductive film while detecting an end-point using a stopper formed on top of the pillar-shaped semiconductor layer; forming a second dielectric or gate conductive film; etching the second dielectric or gate conductive film and calculating an etching rate during the etching; and detecting an end-point of etching of the first dielectric or gate conductive film, based on the etching rate of the second dielectric or gate conductive film during etching-back of the second dielectric or gate conductive film, to control an etching amount of the first dielectric or gate conductive film.

As described above, the SGT production method of the present invention is capable of, during dry etching for forming a gate electrode, controlling an etching amount using an end-point detection process, to stably set a gate length and a substantial height dimension of a pillar-shaped silicon layer. This makes it possible to produce an SGT with stable characteristics.

What is claimed is:

1. A method of producing a semiconductor device in which at least one pillar-shaped semiconductor layer is provided on a semiconductor substrate, and a dielectric film is provided on respective surfaces of the semiconductor substrate and the at least one pillar-shaped semiconductor layer, the method comprising:

(a) forming a first gate conductive film to cover respective surfaces of the at least one pillar-shaped semiconductor layer and a hard mask formed on a top of the at least one pillar-shaped semiconductor layer;
   (b) after step (a), flattening an upper surface of the first gate conductive film, using the hard mask as a stopper;
   (c) after step (b), forming a second gate conductive film on the flattened surface of the first gate conductive film;
   (d) after step (c), anisotropically etching the second gate conductive film;
   (e) monitoring an intensity of plasma emission emitted from the second gate conductive film during the etching to detect an end-point at which the etching of the second gate conductive film needs to end, based on a change in the plasma emission intensity;

(f) after step (e), anisotropically etching the first gate conductive film; and (g) determining an end-point at which the etching of the first gate conductive film needs to end, using an etching rate of the first gate conductive film determined with a relative ratio between the etching rate of the first gate conductive film and an etching rate of the second gate conductive film calculated from a film thickness of the second gate conductive film and a time taken from a beginning to an end of the etching of the second gate conductive film.

2. The method as defined in claim 1, wherein each of the first gate conductive film and the second gate conductive film is made of polysilicon.

3. The method as defined in claim 1, wherein the first gate conductive film and the second gate conductive film are made of a same metal material.

4. The method as defined in claim 1, wherein the first gate conductive film and the second gate conductive film are made of different metal materials, respectively.

5. The method as defined in claim 1, wherein the semiconductor substrate comprises a diffusion area formed at a lower surface of a respective of the at least one pillar-shaped semiconductor layer, and the method further comprises:

after step (f), patterning the first gate conductive film on a sidewall of the at least one pillar-shaped semiconductor layer to form a gate electrode; and (j) after step (i), forming, on an upper surface of a respective of the at least one pillar-shaped semiconductor layer, a diffusion area having the same conductive type as that of the diffusion area formed at the lower surface of a respective of the at least one pillar-shaped semiconductor layer.

6. A method of producing a semiconductor device in which at least one pillar-shaped semiconductor layer is provided on a semiconductor substrate, the method comprising:

(a) forming a first dielectric film to cover respective surfaces of the at least one pillar-shaped semiconductor layer and a hard mask formed on a top of the at least one pillar-shaped semiconductor layer;

(b) after step (a), flattening an upper surface of the first dielectric film, using the hard mask as a stopper;

after step (b), forming a second dielectric film on the flattened surface of the first dielectric film;

(d) after step (c), anisotropically etching the second dielectric film;

(e) monitoring an intensity of plasma emission emitted from the second dielectric film during the etching to detect an end-point at which the etching of the second dielectric film needs to end, based on a change in the plasma emission intensity;

after step (e), anisotropically etching the first dielectric film;

(g) after step (f), forming a gate electrode extensive over an upper surface of the first dielectric film and a sidewall of the at least one pillar-shaped semiconductor layer; and (h) determining an end-point at which the etching of the first dielectric film needs to end, using an etching rate of the first dielectric film determined with a relative ratio between the etching rate of the first dielectric film and an etching rate of the second dielectric film calculated from a film thickness of the second dielectric film and a time taken from a beginning to an end of the etching of the second dielectric film.

7. The method as defined in claim 6, wherein each of the first dielectric film and the second dielectric film is made of a silicon oxide.

8. The method as defined in claim 6, wherein the semiconductor substrate comprises a diffusion area formed at a lower surface of a respective of the at least one pillar-shaped semiconductor layer, and the method further comprises, after step (g), forming, on an upper surface of a respective of the at least one pillar-shaped semiconductor layer, a diffusion area having the same conductive type as that of the diffusion area formed at the lower surface of a respective of the at least one pillar-shaped semiconductor layer.

* * * * *